(12) United States Patent
Sato et al.

(10) Patent No.: US 11,954,555 B2
(45) Date of Patent: Apr. 9, 2024

(54) SENSOR INTERFACE CIRCUIT AND SENSOR MODULE

(71) Applicants: NISSHINBO MICRO DEVICES INC., Tokyo (JP); TOKYO INSTITUTE OF TECHNOLOGY, Tokyo (JP); ALPS ALPINE CO., LTD., Tokyo (JP)

(72) Inventors: Hiroki Sato, Tokyo (JP); Masayuki Sato, Tokyo (JP); Noboru Ishihara, Tokyo (JP); Shinji Murata, Tokyo (JP)

(73) Assignees: NISSHINBO MICRO DEVICES INC., Tokyo (JP); TOKYO INSTITUTE OF TECHNOLOGY, Tokyo (JP); ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/924,250

(22) PCT Filed: May 7, 2021

(86) PCT No.: PCT/JP2021/017464
§ 371 (c)(1),
(2) Date: Nov. 9, 2022

(87) PCT Pub. No.: WO2022/024488
PCT Pub. Date: Feb. 3, 2022

(65) Prior Publication Data
US 2023/0186040 A1 Jun. 15, 2023

(30) Foreign Application Priority Data
Jul. 30, 2020 (JP) .................................. 2020-129427

(51) Int. Cl.
*G06K 7/10* (2006.01)
*H03B 5/24* (2006.01)
*H03K 21/00* (2006.01)

(52) U.S. Cl.
CPC ........... *G06K 7/10366* (2013.01); *H03B 5/24* (2013.01); *H03B 2200/004* (2013.01); *H03K 21/00* (2013.01)

(58) Field of Classification Search
CPC .............................. G06K 7/10366; H03B 5/24
(Continued)

(56) References Cited

U.S. PATENT DOCUMENTS 11,075,602 B1 * 7/2021 Balmelli ................ H03K 3/011
2019/0267978 A1 * 8/2019 Oshida .................... H03K 5/02
(Continued)

OTHER PUBLICATIONS

Miyauchi et al.; "Low-Power Wireless Sensor Module for RF Backscattering;" IEICE General Conference; 2018; p. 361; vol. B-18-17.
(Continued)

*Primary Examiner* — Ahshik Kim
(74) *Attorney, Agent, or Firm* — Oliff PLC

(57) ABSTRACT

A sensor interface circuit includes: an RF switch having a control node; a bias circuit electrically connected to the control node and applying, to the control node, a voltage at a first level or a second level corresponding to a linear region of a reflection characteristic; a first variable oscillation circuit electrically connectable to a first sensor; a second variable oscillation circuit electrically connectable to a second sensor; and a difference circuit electrically connected between the first variable oscillation circuit and the bias circuit, and between the second variable oscillation circuit and the bias circuit.

11 Claims, 18 Drawing Sheets

(58) Field of Classification Search
USPC .......................................................... 235/451
See application file for complete search history.

(56) References Cited

U.S. PATENT DOCUMENTS

2020/0118797 A1* 4/2020 Oshida ..................... H05H 1/46
2020/0244231 A1* 7/2020 Noto ................... H04L 27/3809

OTHER PUBLICATIONS

Jul. 13, 2021 Search Report issued in International Patent Application No. PCT/JP2021/017464.

* cited by examiner

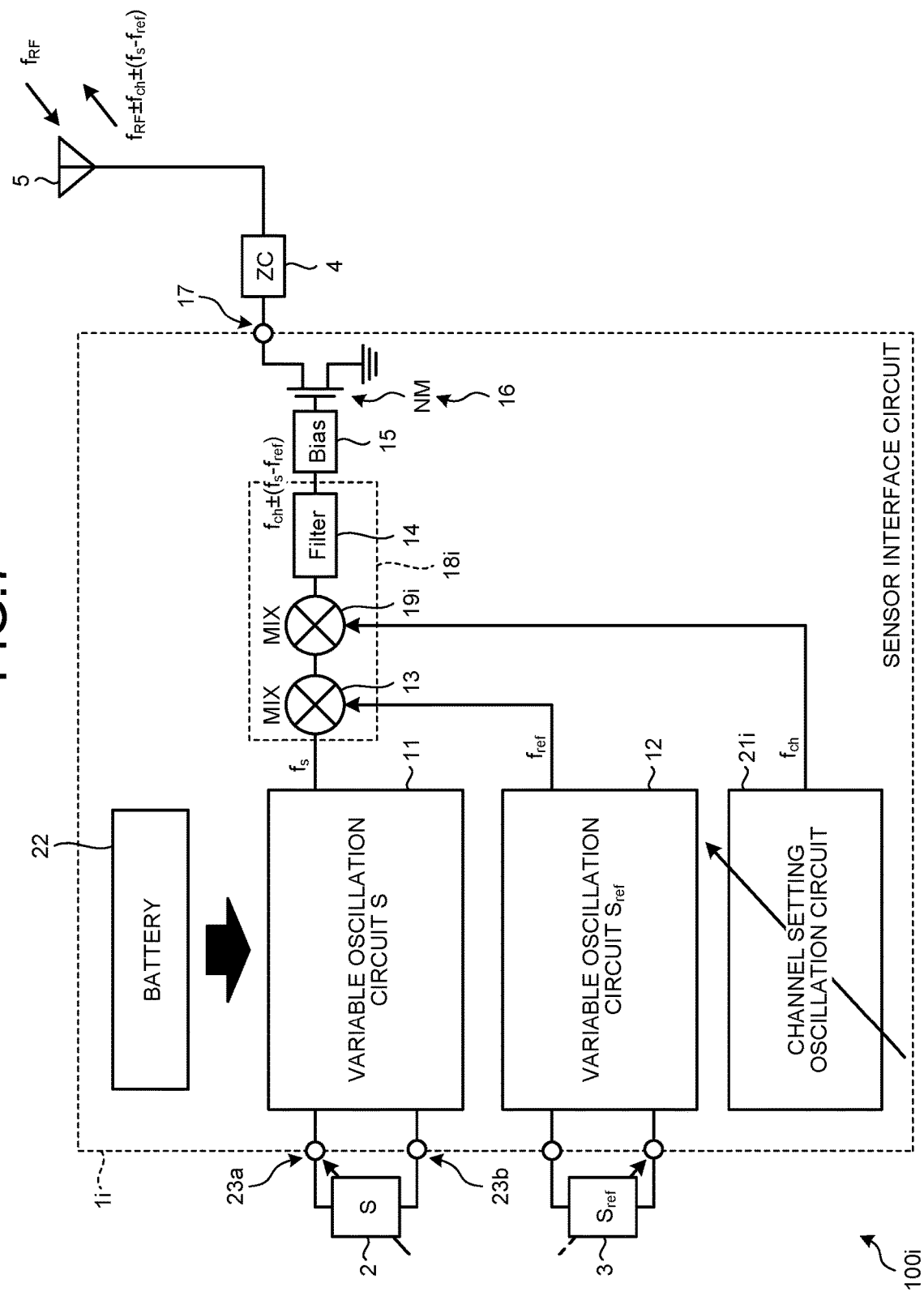

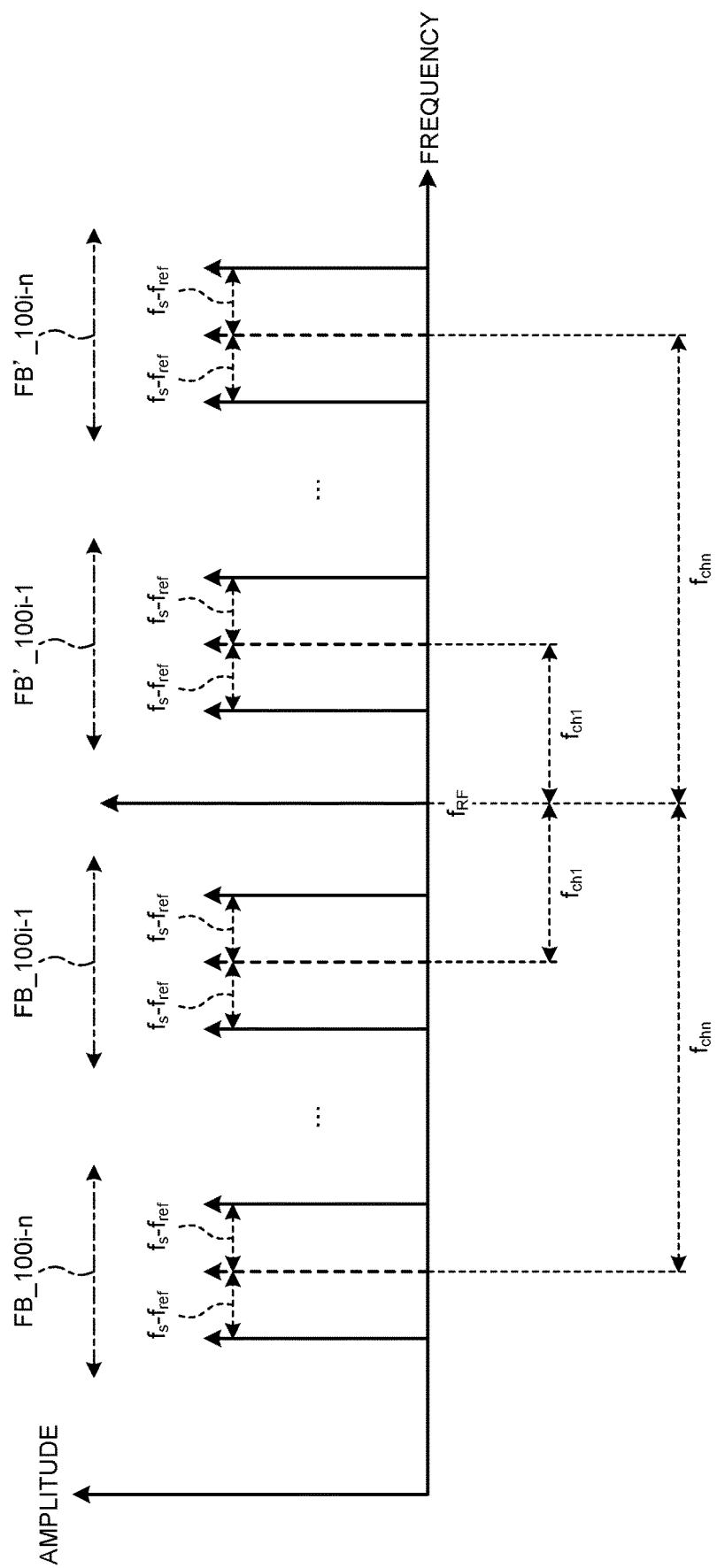

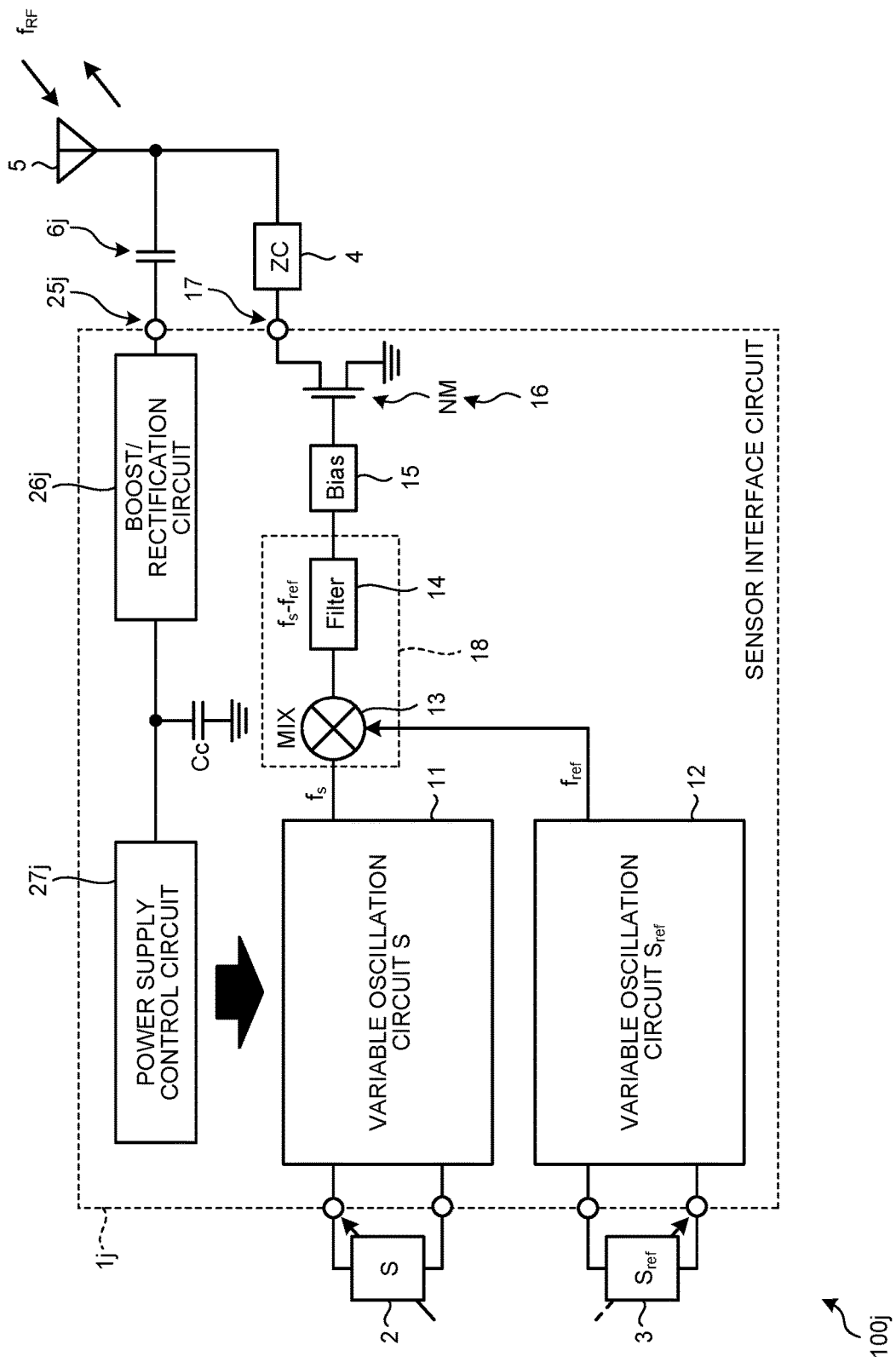

SENSOR INTERFACE CIRCUIT AND SENSOR MODULE

TECHNICAL FIELD

Embodiments of the present specification relate to a sensor interface circuit and a sensor module.

BACKGROUND ART

Radio frequency (RF) backscatter communication has been put into practical use mainly as a wireless memory access technology, and has been widely used as a radio frequency identifier (RFID) technology. It is a mechanism in which an RFID tag is irradiated with a radio signal from an information collection terminal, ID data stored in the memory in the RFID tag is superimposed (modulated) on the received radio signal and reflected, and the ID information is received and read by the information collection terminal. Since the RFID tag reflects a radio signal, a general radio circuit that requires electric power is not needed, thus making battery-less operation possible.

On the other hand, a sensing technology using RF backscatter communication has attracted attention due to the recent expectations for Internet of Things (IoT) technologies. As a sensing technology using RF backscatter communication, an interface circuit for collecting sensor information using RF backscatter communication has been proposed (See, for example, Nonpatent Literature 1).

CITATION LIST

Nonpatent Literature

Nonpatent Literature 1: Kaede Miyauchi, Taichi Taguchi, Yosuke Ishikawa, Hiroyuki Ito, Shiro Dosho, Kazuya Masu, Noboru Ishihara, "Low-Power Wireless Sensor Module for RF Backscattering," IEICE General Conference 2018, Japan, Mar. 20-23, 2018, B-18-17, p. 361.

SUMMARY OF INVENTION

Problems to be Solved by the Invention

In the interface circuit described in Nonpatent Literature 1, RF backscatter communication is performed by generating an oscillation signal obtained by changing an oscillation frequency of a variable oscillation circuit depending on a signal from a sensor, controlling an RF switch according to the oscillation signal, and reflecting or absorbing an RF signal. At this time, the interface circuit transmits a frequency component corresponding to the reflection or absorption of the RF signal to the information collection terminal as a signal.

For example, considering that available bands are limited in RF backscatter communication and multichannel may be used, the interface circuit is desired to improve the frequency accuracy of a signal. In addition, the interface circuit is desired to suppress a harmonic component and secure an available band.

An object of the present invention has been made in view of the above, and is to provide a sensor interface circuit and a sensor module capable of suppressing a harmonic component while improving the frequency accuracy of a signal.

Means for Solving Problem

In order to solve the above problem and achieve the object, a sensor interface circuit according to an aspect of the present invention includes: an RF switch having a control node; a bias circuit electrically connected to the control node and applying, to the control node, a voltage at a first level or a second level corresponding to a linear region of a reflection characteristic; a first variable oscillation circuit electrically connectable to a first sensor; a second variable oscillation circuit electrically connectable to a second sensor; and a difference circuit electrically connected between the first variable oscillation circuit and the second variable oscillation circuit, and the bias circuit.

Effect of the Invention

According to the present invention, it is possible to suppress a harmonic component while improving the frequency accuracy of a signal.

BRIEF DESCRIPTION OF DRAWINGS

FIG. 7 is a diagram illustrating a configuration of a sensor module including a sensor interface circuit according to a first modification of the embodiment.

FIG. 8 is a diagram illustrating frequency components of a transmission signal according to the first modification of the embodiment.

FIG. 9 is a diagram illustrating a configuration of a sensor module including a sensor interface circuit according to a second modification of the embodiment.

DESCRIPTION OF EMBODIMENTS

Figure 1:
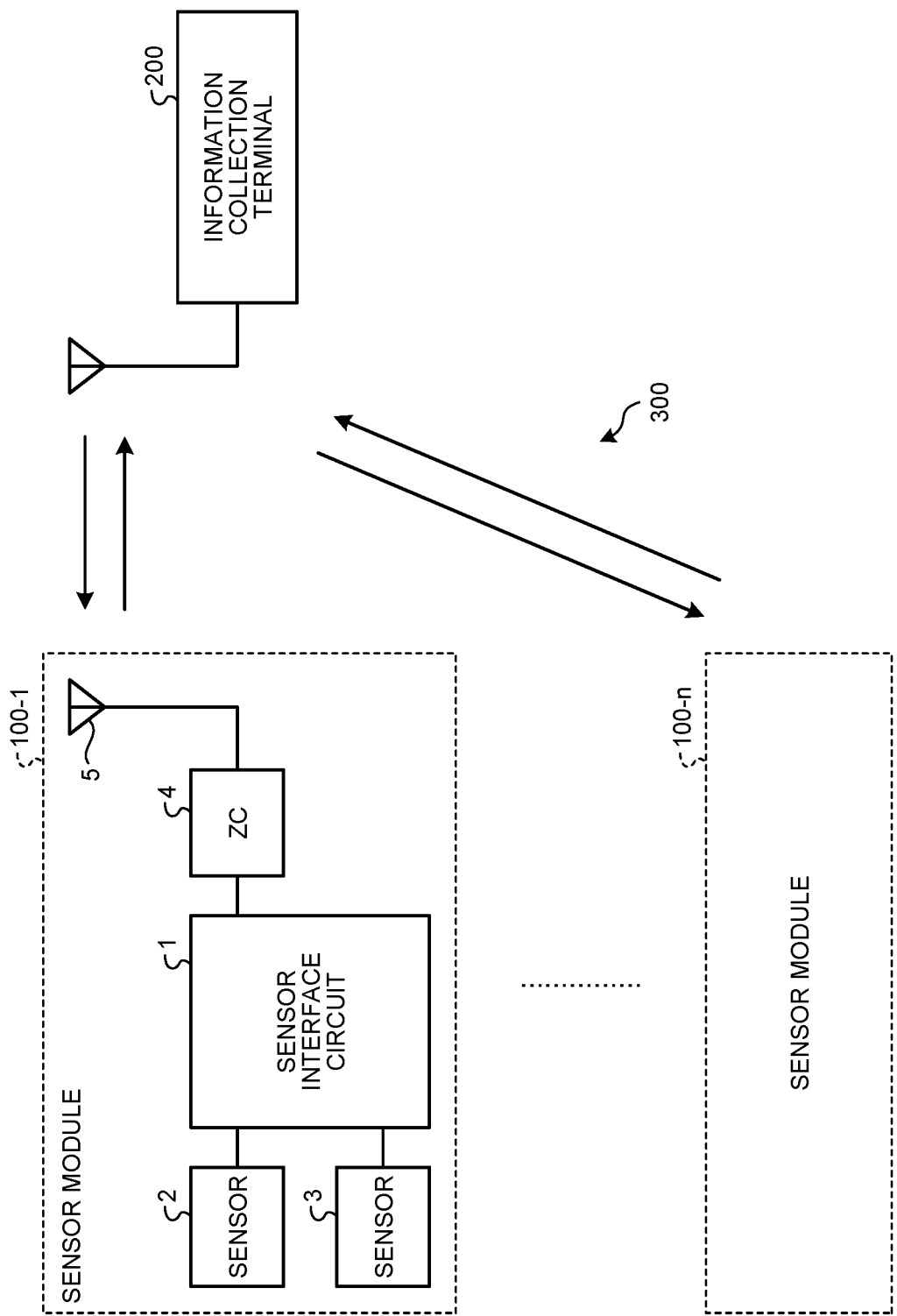
FIG. 1 is a diagram illustrating a configuration of a communication system to which a sensor module including a sensor interface circuit according to an embodiment is applied.

Hereinafter, embodiments of a sensor interface circuit will be described in detail with reference to the drawings. In the following embodiments, portions denoted by the same reference numerals perform the same operation, and redundant description will be omitted as appropriate.

Embodiment

A sensor interface circuit according to the embodiment supports RF backscatter communication and is used for a sensing technology using RF backscatter communication. For example, a sensor module 100 including a sensor interface circuit 1 is configured as illustrated in FIG. 1. FIG. 1 is a diagram illustrating a configuration of a communication system 300 including the sensor module 100 to which the sensor interface circuit 1 is applied.

In the communication system 300, a plurality of sensor modules 100-1 to 100-$n$ and an information collection terminal 200 are configured to be capable of RF backscatter communication. n is an integer of 2 or more. The information collection terminal 200 can transmit an RF signal to each sensor module 100. Each sensor module 100 can transmit a signal corresponding to a detection value of the sensor to the information collection terminal 200 using the RF signal.

Each sensor module 100 includes a sensor 2, the sensor interface circuit 1, and an antenna 5. The sensor interface circuit 1 is electrically connected between the sensor 2 and the antenna 5. The sensor interface circuit 1 has a variable oscillation circuit and an RF switch, and performs RF backscatter communication by changing a frequency of the variable oscillation circuit according to a signal from the sensor 2 and controlling on/off of the RF switch according to the oscillation signal. That is, the sensor interface circuit 1 changes the impedance on the RF switch side as viewed from the antenna 5, reflects and absorbs the RF signal from the information collection terminal 200 according to the sensor information, and transmits the obtained signal to the information collection terminal 200.

At this time, different IDs (identifiers) are assigned to the plurality of sensor modules 100-1 to 100-$n$. The sensor interface circuit 1 transmits a frequency component corresponding to the ID of the sensor module 100 to the information collection terminal 200 as a signal, and transmits a frequency component corresponding to the sensor information to the information collection terminal 200 as another signal. The information collection terminal 200 that has received the RF signal can confirm which of the sensors 2 it is by observing the frequency component corresponding to the ID, and can grasp the state of the sensor 2 by observing the frequency component corresponding to the sensor information.

For example, in RF backscatter communication, the frequency of the RF signal is required to be within a predetermined band stipulated by the Radio Act. When a use case in IoT is considered, it is conceivable to use multichannel in the communication system 300 so as to enable to distinguish signals of the plurality of sensor modules 100-1 to 100-$n$ from each other. In this case, each sensor interface circuit 1 transmits a signal having a frequency different from that of the sensor interface circuit 1 of the other sensor modules 100.

However, if the oscillation frequency of the variable oscillation circuit varies due to environmental variation or the like and then the frequency of the RF signal varies, deviation from the predetermined band may occur or it may become difficult to use multichannel. Therefore, the interface circuit 1 is desired to improve the frequency accuracy of the signal.

In addition, in the sensor interface circuit 1, if the reflection characteristics of the RF signal are nonlinearly distorted, a peak of a harmonic component appears in the frequency spectrum of the RF signal, in addition to the peak of the fundamental wave. As a result, an available band of the RF signal within the predetermined band may be limited and it may become difficult to use multichannel. Therefore, the interface circuit 1 is desired to suppress a harmonic component and secure an available band.

Therefore, in the present embodiment, the sensor interface circuit 1 generates a sensor signal as a difference signal from a signal of another sensor, and biases the RF switch such that the reflection coefficient linearly changes according to the difference signal, thereby improving the frequency accuracy of the signal and suppressing a harmonic component.

Specifically, it is aimed for the sensor interface circuit 1 to:

(1) eliminate the necessity of a general wireless communication circuit (for example, a power amplifier) and enable long-term battery operation or battery-less operation;
(2) enable to collect sensor information with high sensitivity and high resolution;
(3) enable to support a large number of various sensors;
(4) enable to form it as a monolithic integrated circuit for downsizing; and
(5) enable to implement it at low cost. To this end, a plurality of variable oscillation circuits are provided in the sensor interface circuit 1 to make it possible to obtain the sensor signal as a difference from the signal of another sensor. In the sensor interface circuit 1, a first variable oscillation circuit electrically connectable to a first sensor and a second variable oscillation circuit electrically connectable to a second sensor are provided. The first sensor is a sensor for acquiring its detection value, and the second sensor is a sensor serving as a reference for obtaining a difference signal, in which the detection value is unlikely to be changed according to the environment or in which the detection value changes in a direction opposite to that of the first sensor. In the sensor interface circuit 1, a difference circuit is provided on the output side of the first variable oscillation circuit and the second variable oscillation circuit, and the difference circuit generates a difference signal between a first oscillation signal from the first variable oscillation circuit corresponding to the detection value of the first sensor and a second oscillation signal from the second variable oscillation circuit corresponding to the detection value of the second sensor. With this configuration, even if the oscillation frequency varies due to environmental variation or the like in each of the first variable oscillation circuit and the second variable oscillation circuit, it is possible to generate the difference signal in which the influence of the variation is suppressed and to improve the frequency accuracy of the signal. The difference circuit supplies a control signal corresponding to the difference signal to a bias circuit. The bias circuit applies, according to the control signal, a voltage at a first level or second level corresponding to the linear region of the reflection characteristics to the control node of the RF switch. The first level corresponds to a large reflection coefficient that can be substantially regarded as the reflection of the RF signal, and the second level corresponds to a small reflection coefficient that can be substantially regarded as the absorption of the RF signal. With this configuration, it is possible to linearize the reflection and absorption characteristics of the RF signal at the RF switch, and suppress a harmonic component in the frequency spectrum of the RF signal. Thus, it is possible to suppress a harmonic component while improving the frequency accuracy of a signal.

More specifically, as illustrated in FIG. 1, a reference sensor 3 is added to each sensor module 100 that has the sensor 2. The sensor 2 is a sensor for acquiring its detection value. The reference sensor 3 is a sensor serving as a reference for obtaining a difference signal, in which the detection value is unlikely to be changed according to the environment.

Alternatively, the sensor for obtaining the difference signal with respect to the signal of the sensor 2 may be a sensor in which the detection value is changed according to the environment similarly to the sensor 2 but outputs a reference detection value when it is put in a reference environment, instead of the reference sensor 3 in which the detection value is unlikely to be changed according to the environment. For example, when the sensor 2 is an illuminance sensor, a sensor fixedly irradiated with white light may be used as the sensor for obtaining the difference signal.

Alternatively, the sensor for obtaining the difference signal from the signal of the sensor 2 may be a sensor in which the detection value is changed in an opposite direction to that of the sensor 2 in response to the environmental change, instead of the reference sensor 3 in which the detection value is unlikely to be changed according to the environment.

Figure 2:
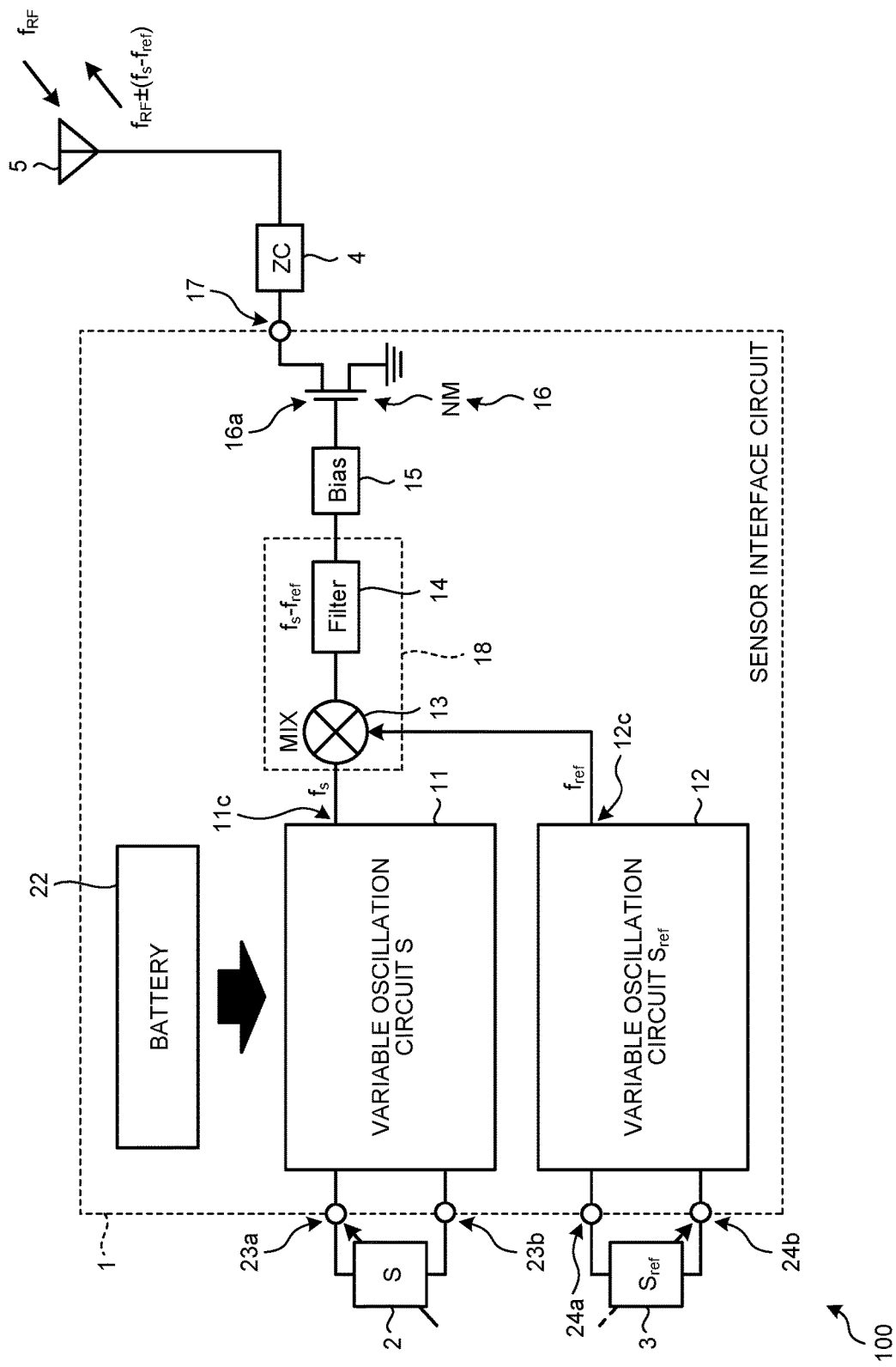
FIG. 2 is a diagram illustrating a configuration of the sensor module including the sensor interface circuit according to the embodiment.

At this time, the sensor interface circuit 1 of each sensor module 100 can be configured as illustrated in FIG. 2, for example. FIG. 2 is a diagram illustrating a configuration of the sensor interface circuit 1. The sensor interface circuit 1 includes a variable oscillation circuit 11, a variable oscillation circuit 12, a difference circuit 18, a bias circuit 15, an RF switch 16, and a battery 22. The difference circuit 18 includes a mixer circuit 13 and a filter circuit 14.

The variable oscillation circuit 11 is electrically connectable to the sensor 2 via sensor terminals 23a and 23b, and an output node 11c is electrically connected to the mixer circuit 13 of the difference circuit 18. The variable oscillation circuit 12 is electrically connectable to the reference sensor 3 via sensor terminals 24a and 24b, and an output node 12c is electrically connected to the mixer circuit 13 of the difference circuit 18. The difference circuit 18 is electrically connected between the variable oscillation circuit 11 and the bias circuit 15 and between the variable oscillation circuit 12 and the bias circuit 15. The mixer circuit 13 is electrically connected between the variable oscillation circuit 11 and the filter circuit 14 and between the variable oscillation circuit 12 and the filter circuit 14. The filter circuit 14 is electrically connected between the mixer circuit 13 and the bias circuit 15. The output node of the bias circuit 15 is electrically connected to a control node 16a of the RF switch 16. The RF switch 16 is electrically connected between an antenna terminal 17 and a ground potential. The RF switch 16 includes, for example, a transistor NM. The transistor NM is, for example, an NMOS transistor, the drain of which is electrically connected to the antenna terminal 17, the source of which is electrically connected to the ground potential, and the gate of which functions as the control node 16a.

Figure 3:
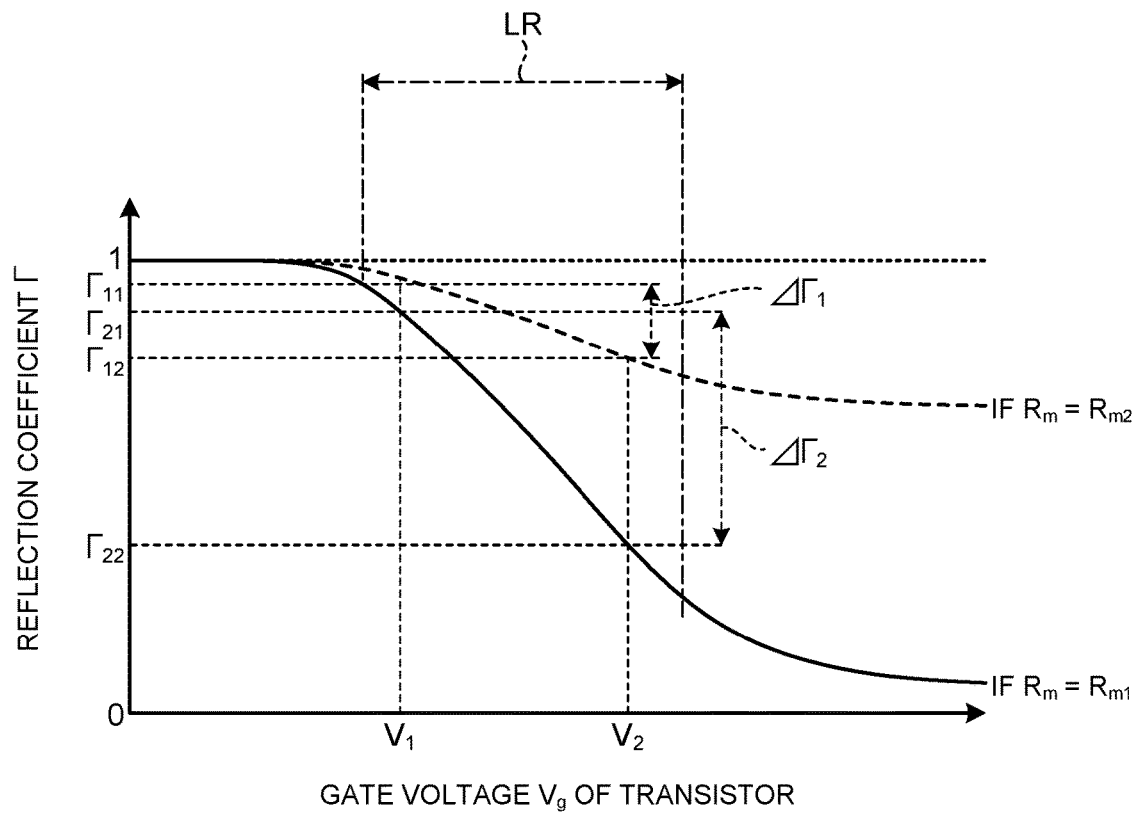
FIG. 3 is a diagram illustrating a linear region of reflection characteristics within which an RF switch is to be operated according to the embodiment.

The bias circuit 15 applies a voltage at a level in a linear region LR of the reflection characteristics as illustrated in FIG. 3 to the control node 16a. FIG. 3 is a diagram illustrating the linear region LR of the reflection characteristics within which the RF switch 16 is to be operated. The reflection characteristics indicate a change in reflection coefficient corresponding to the gate voltage of the transistor NM. The linear region LR is a region in which the reflection coefficient in the reflection characteristics linearly changes. A level $V_1$ is a level at which transistor NM is substantially turned off, and corresponds to a large reflection coefficient corresponding to the reflection of RF backscatter communication. A level $V_2$ is a level at which transistor NM is substantially turned on, and corresponds to a small reflection coefficient corresponding to the absorption of RF backscatter communication.

When the antenna 5 is connected directly to the RF switch 16, a resistance value Rm on the RF switch 16 side as viewed from the antenna 5 can be a large resistance value $Rm_2$ (for example, 500Ω) if the transistor NM serving as the RF switch 16 is miniaturized. When the resistance value on the RF switch 16 side as viewed from the antenna 5 is $Rm_2$ as illustrated in FIG. 3, the reflection characteristics are as indicated by a dotted line, and the difference $\Delta\Gamma_1=\Gamma_{11}-\Gamma_{12}$ between the reflection coefficient $\Gamma_{11}$ corresponding to the level $V_1$ and the reflection coefficient $\Gamma_{12}$ corresponding to the level $V_2$ in the linear region LR is small. That is, it is difficult to secure the reflection coefficient difference in the linear region LR of the reflection characteristics on the RF switch 16 side.

On the other hand, if the size of the transistor NM serving as the RF switch 16 is increased, the on-resistance value of the RF switch 16 can be a smaller resistance value $Rm_1$ (For example, 50Ω). When the resistance value Rm on the RF switch 16 side as viewed from the antenna 5 is $Rm_1$ as illustrated in FIG. 3, the reflection characteristics are as indicated by a solid line, and the difference $\Delta\Gamma_2=\Gamma_{21}-\Gamma_{22}$ between the reflection coefficient $\Gamma_{21}$ corresponding to the level $V_1$ and the reflection coefficient $\Gamma_{22}$ corresponding to the level $V_2$ in the linear region LR is relatively large. That is, it is possible to secure a large difference in reflection coefficient in the linear region LR of the reflection characteristics on the RF switch 16 side. However, since the size of the transistor NM serving as the RF switch 16 is large, the circuit area of the sensor interface circuit 1 is likely to be increased.

Figure 4:
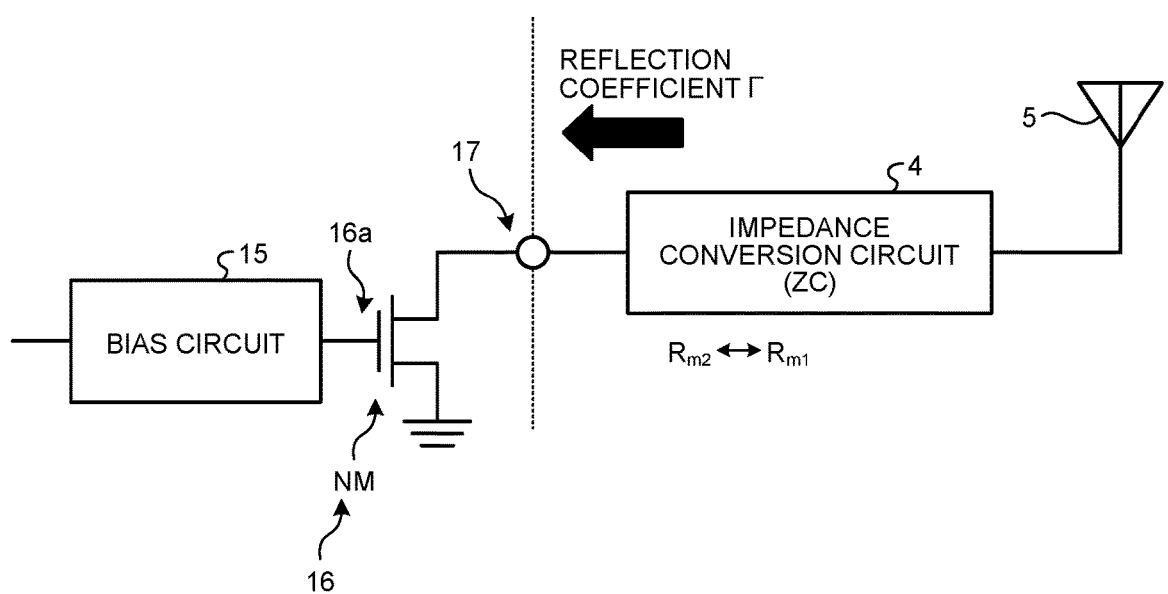
FIG. 4 is a diagram illustrating an operation of an impedance conversion circuit according to the embodiment.

Therefore, in the sensor module 100 illustrated in FIG. 1, an impedance conversion circuit (ZC) 4 is electrically connected between the sensor interface circuit 1 and the antenna 5. As illustrated in FIG. 4, the impedance conversion circuit 4 performs impedance conversion between the resistance value $Rm_2$ suitable for miniaturization of the RF switch 16 (transistor NM) and the resistance value $Rm_1$ suitable for securing the reflection coefficient difference. FIG. 4 is a diagram illustrating an operation of the impedance conversion circuit 4. With this configuration, the resistance value on the RF switch 16 side as viewed from the antenna 5 can be set to $Rm_1$ while miniaturizing the transistor NM serving as the RF switch 16 (that is, while setting the on-resistance value to $Rm_2$), and it is possible to secure a large reflection coefficient difference in the linear region LR of the reflection characteristics on the RF switch 16 side.

The sensor interface circuit 1 illustrated in FIG. 2 includes the two variable oscillation circuits 11 and 12. The oscillation frequency of each of the variable oscillation circuits 11 and 12 is set by the sensor 2 and the reference sensor 3. The variable oscillation circuit 11 performs oscillation operation according to the detection value of the sensor 2, and generates an oscillation signal S having a frequency fs. The variable oscillation circuit 12 performs oscillation operation according to the detection value of the reference sensor 3, and generates an oscillation signal Sref having a frequency fref.

For example, when the detection value of the sensor 2 is a high value d1, the variable oscillation circuit 11 generates the oscillation signal S having a frequency fs=fs1 corresponding to d1. When the detection value of the sensor 2 is a low value d2 (<d1), the variable oscillation circuit 11 generates the oscillation signal S having a frequency fs=fs2 (<fs1) corresponding to d2. In either case, the variable oscillation circuit 12 generates the oscillation signal Sref having the same frequency fref.

The mixer circuit 13 receives the oscillation signal S having the frequency fs from the variable oscillation circuit 11, receives the oscillation signal Sref having the frequency fref from the variable oscillation circuit 12, and generates the oscillation signal S1 having a frequency fs−fref and the oscillation signal S2 having a frequency fs+fref. The filter circuit 14 extracts the oscillation signal S1 having the frequency fs−fref from the output of the mixer circuit 13 as a modulation signal and supplies the modulation signal to the bias circuit 15. The filter circuit 14 can use a low pass filter or a band pass filter that includes the frequency fs−fref and does not include the frequency fs+fref in its pass band. That is, the difference circuit 18 obtains a difference between the oscillation signal S from the variable oscillation circuit 11 and the oscillation signal Sref from the variable oscillation circuit 12, and generates a modulation signal having the frequency fs−fref. The duty ratio of the modulation signal may be approximately 50%.

Figure 5A:
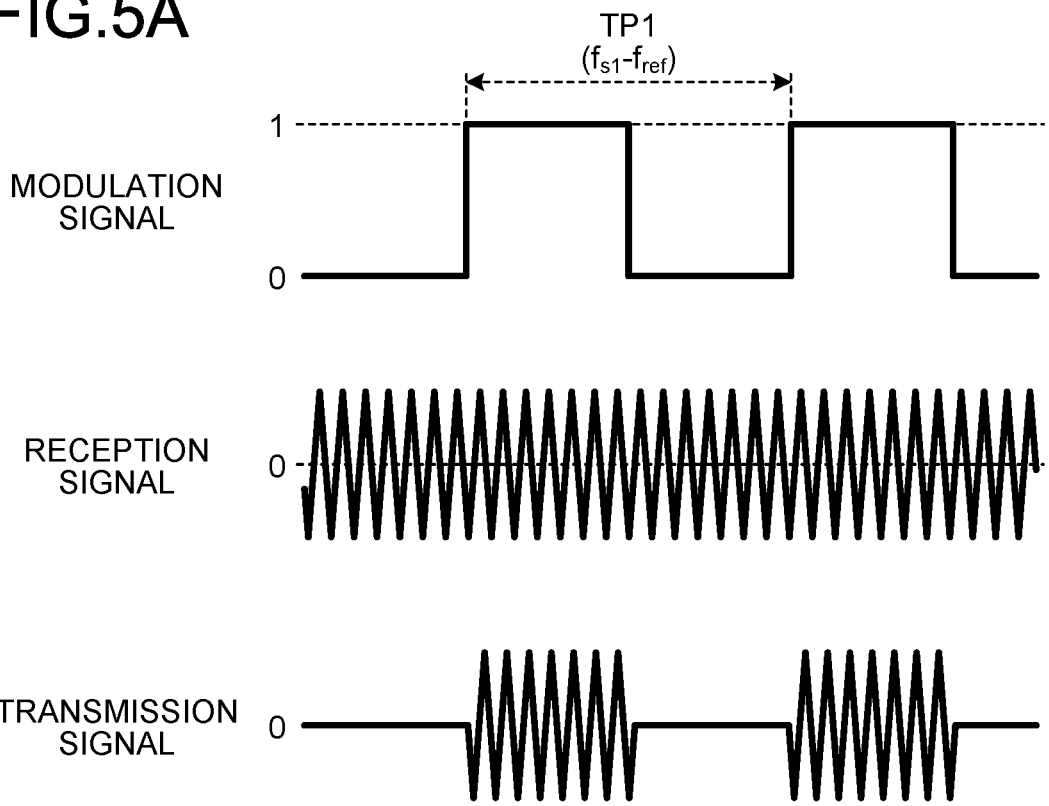
FIGS. 5A and 5B are diagrams illustrating a modulation signal, a reception signal, and a transmission signal according to the embodiment.

For example, when the detection value of the sensor 2 is the high value d1 and the variable oscillation circuit 11 generates the oscillation signal S having the frequency fs=fs1 corresponding to d1, the difference circuit 18 generates the modulation signal having a frequency fs1−fref as illustrated in FIG. 5A. A cycle TP1 is a cycle corresponding to the frequency fs1−fref.

Figure 5B:
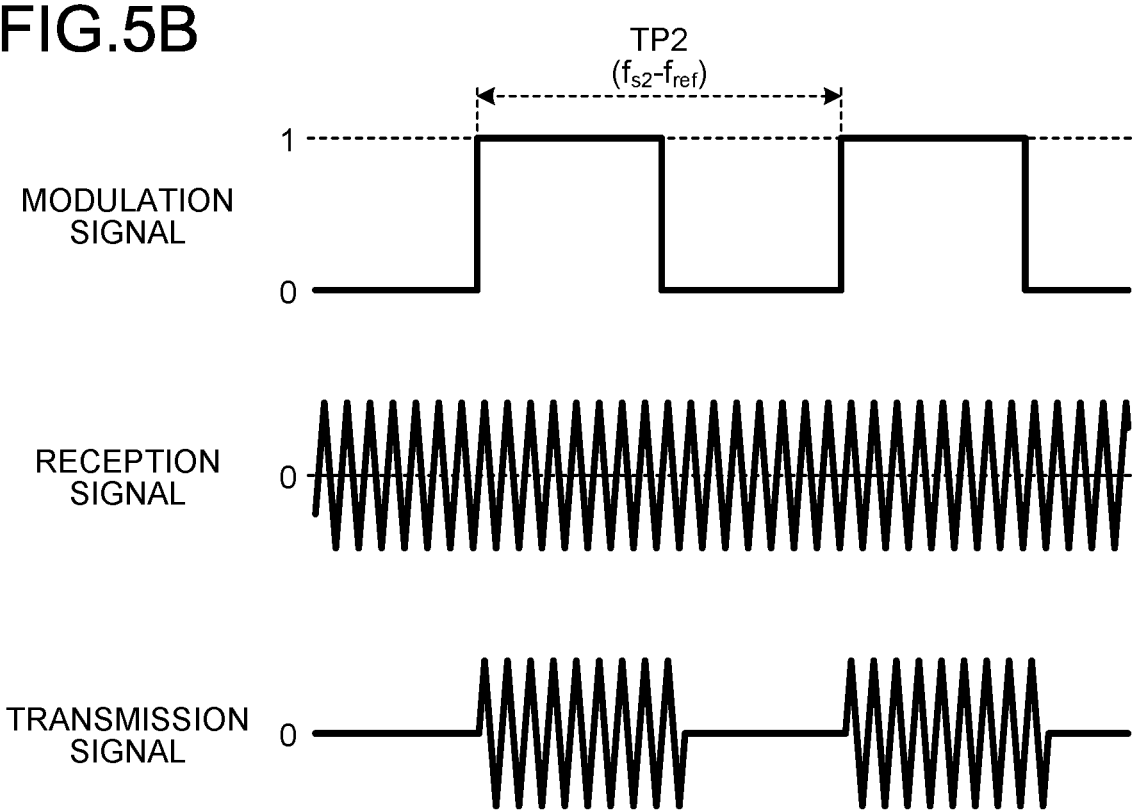

When the detection value of the sensor 2 is the low value d2 (<d1) and the variable oscillation circuit 11 generates the oscillation signal S having the frequency fs=fs2 corresponding to d2, the difference circuit 18 generates the modulation signal having a frequency fs2−fref (<fs1−fref) as illustrated in FIG. FIG. 5B. A cycle TP2 is a cycle corresponding to the frequency fs2−fref, and is longer than the cycle TP1.

The bias circuit 15 illustrated in FIG. 2 turns on and off the RF switch 16 to control signal reflection according to the ID of the sensor module 100. In addition, upon receipt of the modulation signal having the frequency fs−fref from the difference circuit 18, the bias circuit 15 turns on and off the RF switch 16 according to the modulation signal to control signal reflection.

For example, when the detection value of the sensor 2 is the high value d1 and the variable oscillation circuit 11 generates the oscillation signal S having the frequency fs=fs1 corresponding to d1, the RF switch 16 is turned on and off according to the modulation signal illustrated in FIG. 5A, and the "reception signal" of the antenna 5 is reflected or absorbed as indicated by the "transmission signal." The cycle of reflection and absorption is substantially equal to the cycle TP1.

When the detection value of the sensor 2 is the low value d2 (<d1) and the variable oscillation circuit 11 generates the oscillation signal S having the frequency fs=fs2 corresponding to d2, the RF switch 16 is turned on and off according to the modulation signal illustrated in FIG. 5B, and the reception signal of the antenna 5 is reflected or absorbed such that the "reception signal" indicates a "transmission signal." The cycle of reflection and absorption is substantially equal to the cycle TP2 (>TP1).

Figure 6A:
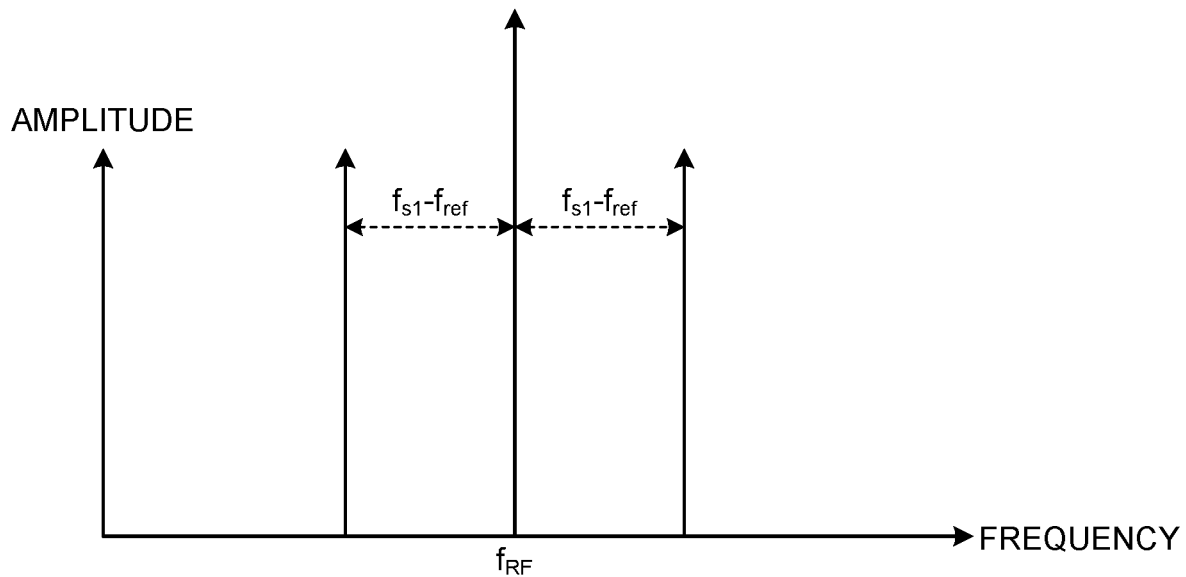
FIGS. 6A and 6B are diagrams illustrating a frequency spectrum of the transmission signal according to the embodiment.
Figure 6B:
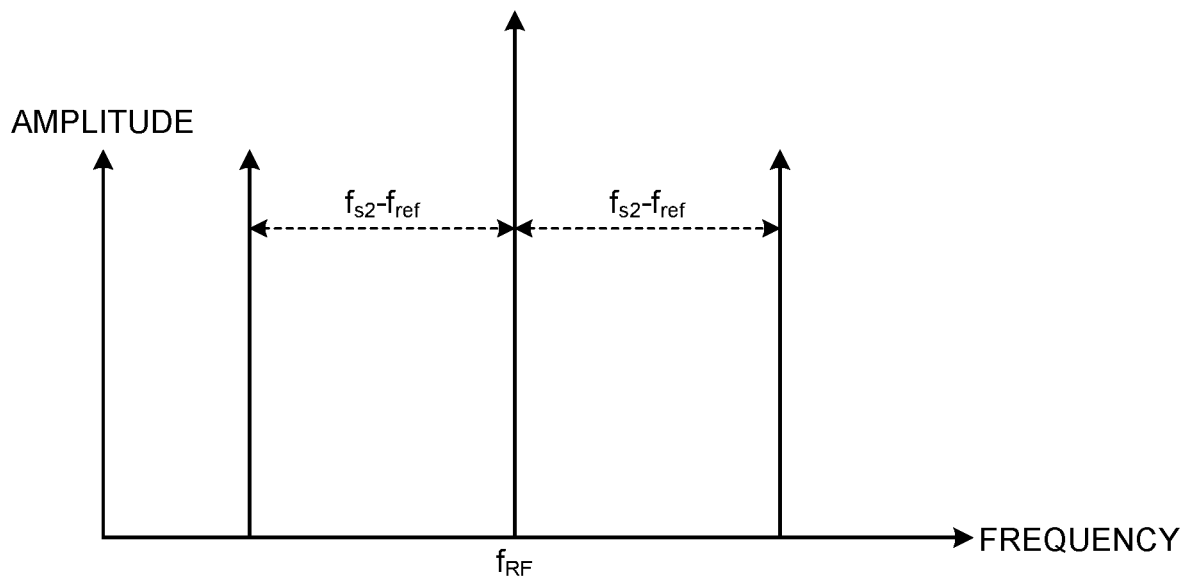

The frequency characteristics of the transmission signal are as illustrated in FIGS. 6A and 6B. FIGS. 6A and 6B are diagrams illustrating a frequency spectrum of the transmission signal. Since the RF switch 16 behaves as an RF mixer, the output fs−fref of the difference circuit is up-converted to the RF band near a frequency $f_{RF}$.

For example, when the detection value of the sensor 2 is the high value d1 and the variable oscillation circuit 11 generates the oscillation signal S having the frequency fs=fs1 corresponding to d1, the frequency spectrum of the transmission signal is as illustrated in FIG. 6A. In the frequency spectrum illustrated in FIG. 6A, a signal component having a frequency $f_{RF}-(fs1-fref)$ and a signal component having a frequency $f_{RF}+(fs1-fref)$ appear, in addition to a carrier component having the frequency $f_{RF}$.

When the detection value of the sensor 2 is the low value d2 (<d1) and the variable oscillation circuit 11 generates the oscillation signal S having the frequency fs=fs2 corresponding to d2, the frequency spectrum of the transmission signal is as illustrated in FIG. 6B. In the frequency spectrum illustrated in FIG. 6B, a signal component having a frequency $f_{RF}-(fs2-fref)$ and a signal component having a frequency $f_{RF}+(fs2-fref)$ appear, in addition to a carrier component having the frequency $f_{RF}$.

The information collection terminal 200 may have sensor information indicating the correspondence relationship between the detection value of the sensor 2 and the oscillation frequency, and information on the reference frequency fref. As illustrated in FIGS. 6A and 6B, the information collection terminal 200 that has received the RF signal from the sensor module 100 can obtain a difference between the frequency of the signal component and the frequency $f_{RF}$ of the carrier component in the frequency spectrum of the RF signal. The information collection terminal 200 can obtain the oscillation frequency fs of the variable oscillation circuit 11 according to the difference and the reference frequency fref, and can obtain the detection value of the sensor 2 according to the oscillation frequency fs and the sensor information.

In the configuration of the sensor interface circuit 1 illustrated in FIG. 2, by obtaining a difference between the oscillation signal corresponding to the sensor 2 and the oscillation signal corresponding to the reference sensor 3, it is possible to cancel a noise component due to external noise or temperature dependency applied to the oscillation signal corresponding to the sensor 2, and thus to perform sensing operation with high accuracy and high resolution. In addition, by using the difference signal as a backscatter control signal, it is possible to perform sensing operation in a narrow band. Thus, it is possible to deploy a large number of pieces of information of a plurality of sensor modules having different oscillation frequencies on the frequency axis. Furthermore, in this configuration, a large difference in reflection coefficient can be obtained by adding the impedance conversion circuit (ZC) 4 between the antenna 5 and the RF switch 16. When a general antenna having an impedance of 50Ω is directly connected, it is necessary to increase the size of the RF switch 16 (transistor NM) to reduce the on-resistance to 50Ω. However, by adding the impedance conversion circuit 4 that converts the impedance of 50Ω to a high resistance and performing reflection for the high resistance, it is possible to secure a large reflection coefficient difference while reducing the size of the RF switch (transistor), thus making it possible to perform long-distance transmission for communication. Since the impedance conversion circuit 4 can be implemented with a combination of an inductor and a capacitor, the conversion operation does not require electric power. In addition, the bias circuit 15 biases the gate of the transistor NM serving as the RF switch 16 to be within the linear region and linearly changes the reflection coefficient. With this configuration, it is possible to suppress generation of a spurious signal such as a harmonic component during switching of the transistor NM serving as the RF switch 16.

The variable oscillation circuit 11 and the variable oscillation circuit 12 are each configured such that power can be supplied from the battery 22. Since the variable oscillation circuit 11 and the variable oscillation circuit 12 each perform oscillation operation at a low frequency suitable for generating the difference signal, power consumption is reduced. Since the sensor interface circuit 1 performs passive wireless communication based on the reflection and absorption of the RF signal from the information collection terminal 200, it does not require a circuit consuming large power such as a power amplifier and thus power consumption is small as a whole. Therefore, the battery 22 can be operated for a long time.

As described above, in the present embodiment, the sensor interface circuit 1 generates the signal of the sensor 2 as the difference signal from the signal of another sensor such as the reference sensor 3, and biases the RF switch 16 such that the reflection coefficient linearly changes according to the difference signal. With this configuration, it is possible to suppress (for example, cancel) the influence of variation using the difference signal when the oscillation frequency of the variable oscillation circuit 11 corresponding to the sensor 2 varies due to environmental variations or the like. As a result, it is possible to improve the frequency accuracy of the signal corresponding to the reflection and absorption of the RF signal by turning on and off the RF switch 16 according to the difference signal. In addition, the RF switch 16 can be turned on and off in the linear change region of the reflection characteristics, so that the transmission signal can be prevented from including a harmonic component. Therefore, it is possible to easily put the RF signal in a predetermined band, collect sensor information with high sensitivity and high resolution, and support a wide variety of sensors.

Alternatively, in the communication system 300, the information collection terminal 200 may transmit RF signals to the plurality of sensor modules 100-1 to 100-$n$ in a time-sharing system. In this case, upon receipt of the RF signal from the sensor module 100, the information collection terminal 200 can confirm which of the sensors 2 it is by observing the frequency component corresponding to the ID, and can grasp the state of the sensor 2 by observing the frequency component corresponding to the sensor information.

First Modification of Embodiment

Alternatively, a plurality of sensor modules 100$i$-1 to 100$i$-$n$ in the communication system 300 may be assigned different channel frequencies fch1 to fchn, instead of being assigned different IDs. For example, a sensor interface circuit 1$i$ can be configured as illustrated in FIG. 7. FIG. 7 is a diagram illustrating a configuration of the sensor module 100$i$ including the sensor interface circuit 1$i$ according to a first modification of the embodiment.

The sensor interface circuit 1$i$ includes a difference circuit 18$i$ instead of the difference circuit 18 (see FIG. 2), and further includes a channel setting oscillation circuit 21$i$. In the channel setting oscillation circuit 21$i$, a channel frequency fch corresponding to the sensor module 100$i$ is preset. The difference circuit 18$i$ further includes a mixer circuit 19$i$. The mixer circuit 19$i$ is electrically connected between the mixer circuit 13 and the filter circuit 14. Alternatively, the difference circuit 18$i$ may be configured such that the mixer circuit 13 is electrically connected between the mixer circuit 19$i$ and the filter circuit 14.

For example, in the sensor module 100$i$-1, a channel frequency fch=fch1 is preset in the channel setting oscillation circuit 21$i$. The mixer circuit 19$i$ receives the oscillation signal S1 having the frequency fs−fref and the oscillation signal S2 having the frequency fs+fref from the mixer circuit 13, receives an oscillation signal Sch having the frequency fch1 from the channel setting oscillation circuit 21$i$, and generates an oscillation signal S1' having a frequency fch1±(fs−fref) and an oscillation signal S2' having a frequency fch1±(fs+fref). The filter circuit 14 extracts the oscillation signal S1' having the frequency fch1±(fs−fref) from the output of the mixer circuit 19$i$ as a modulation signal and supplies the modulation signal to the bias circuit 15. The bias circuit 15 turns on and off the RF switch 16 to control signal reflection according to the modulation signal having the frequency fch1±(fs−fref).

As a result, in the frequency spectrum of the transmission signal, as illustrated in FIG. 8, a signal component having a frequency $f_{RF}$−fch1±(fs1−fref) appears in a band FB_100$i$-1, and a signal component having a frequency $f_{RF}$+fch1±(fs1−fref) appears in a band FB'_100$i$-1, in addition to the carrier component having the frequency $f_{RF}$. The bands FB_100$i$-1 and FB'_100$i$-1 are bands for the sensor module 100$i$-1.

Similarly, in the sensor module 100$i$-$n$, a channel frequency fch=fchn (≠fch1) is preset in the channel setting oscillation circuit 21$i$. The mixer circuit 19$i$ receives the oscillation signal S1 having the frequency fs−fref and the oscillation signal S2 having the frequency fs+fref from the mixer circuit 13, receives an oscillation signal Sch having a frequency fchn from the channel setting oscillation circuit 21$i$, and generates an oscillation signal S1' having a frequency fchn±(fs−fref) and an oscillation signal S2' having a frequency fchn±(fs+fref). The filter circuit 14 extracts the oscillation signal S1' having the frequency fchn±(fs−fref) from the output of the mixer circuit 19$i$ as a modulation signal and supplies the modulation signal to the bias circuit 15. The bias circuit 15 turns on and off the RF switch 16 to control signal reflection according to the modulation signal having the frequency fchn±(fs−fref). As a result, in the frequency spectrum of the transmission signal, as illustrated in FIG. 8, a signal component having a frequency $f_{RF}$−fchn±(fs1−fref) appears in a band FB_100$i$-$n$, and a signal component having a frequency $f_{RF}$+fchn±(fs1−fref) appears in a band FB'_100$i$-$n$. The bands FB_100$i$-$n$ and FB'_100$i$-$n$ are bands for the sensor module 100$i$-$n$.

As the channel frequencies fch1 to fchn different from each other are assigned to the plurality of sensor modules 100$i$-1 to 100$i$-$n$ in the communication system 300 in this way, it becomes possible to use multichannel. As a result, it is possible to simultaneously transmit signals corresponding to the detection values of the sensors from the plurality of sensor modules 100$i$-1 to 100$i$-$n$ to the information collection terminal 200, making it possible to efficiently collect the sensor information at the information collection terminal 200.

Second Modification of Embodiment

Alternatively, each sensor module 100$j$ may be configured such that the energy of the RF signal can be charged to a sensor interface circuit 1$j$, as illustrated in FIG. 9. FIG. 9 is a diagram illustrating a configuration of a sensor module 100$j$ including a sensor interface circuit 1$j$ according to a second modification of the embodiment.

In the embodiment or the first modification of the embodiment, the operating frequency of the variable oscillation circuits 11, 12 can be a low frequency signal that can follow the change in the sensor value. For this reason, the sensor interface circuits 1 and 1$i$ illustrated in FIGS. 2 and 7 can basically operate with low power consumption. Therefore, it is considered that the operation is possible even using weak environmental energy.

Based on such an idea, as illustrated in FIG. 9, a coupling capacitance 6$j$ is electrically connected between a sensor interface circuit 1$j$ and the antenna 5 in a sensor module 100$j$. The coupling capacitance 6$j$ has one end electrically connected to the antenna 5, and the other end electrically connected to an antenna terminal 25$j$ of the sensor interface circuit 1$j$. The sensor interface circuit 1$j$ further includes a boost/rectification circuit 26$j$ and a power supply control circuit 27$j$. The boost/rectification circuit 26$j$ is electrically connected between the antenna terminal 25$j$ and a power storage element Cc. The power supply control circuit 27$j$ is electrically connected between the energy storage element Cc and the variable oscillation circuits 11 and 12. The power storage element Cc is, for example, a capacitive element, and has one end electrically connected to a line connecting the boost/rectification circuit 26$j$ and the power supply control circuit 27$j$, and the other end electrically connected to a ground potential. FIG. 9 is a diagram illustrating a configuration of the sensor interface circuit 1$j$ according to the second modification of the embodiment.

The boost/rectification circuit 26$j$ boosts and rectifies the RF signal transmitted from the antenna 5 via the coupling capacitance 6$j$, and supplies the boosted and rectified RF signal to the power storage element Cc. The power supply control circuit 27$j$ interrupts power supply to the variable oscillation circuits 11 and 12 to store electric charge in the power storage element Cc during a first period. The power supply control circuit 27$j$ supplies power to the variable oscillation circuits 11 and 12 using the electric charge in the power storage element Cc during a second period.

That is, in the sensor interface circuit 1$j$, electromagnetic waves (RF signal) from the information collection terminal 200 are boosted/rectified to store energy in the power storage element Cc, enabling power supply to the sensor circuit including the variable oscillation circuits 11 and 12 when predetermined power is stored by the power supply control circuit 27$j$. With this configuration, operation of the sensor module 100$j$ without the battery 22 (battery-less operation) is possible.

Figure 10:
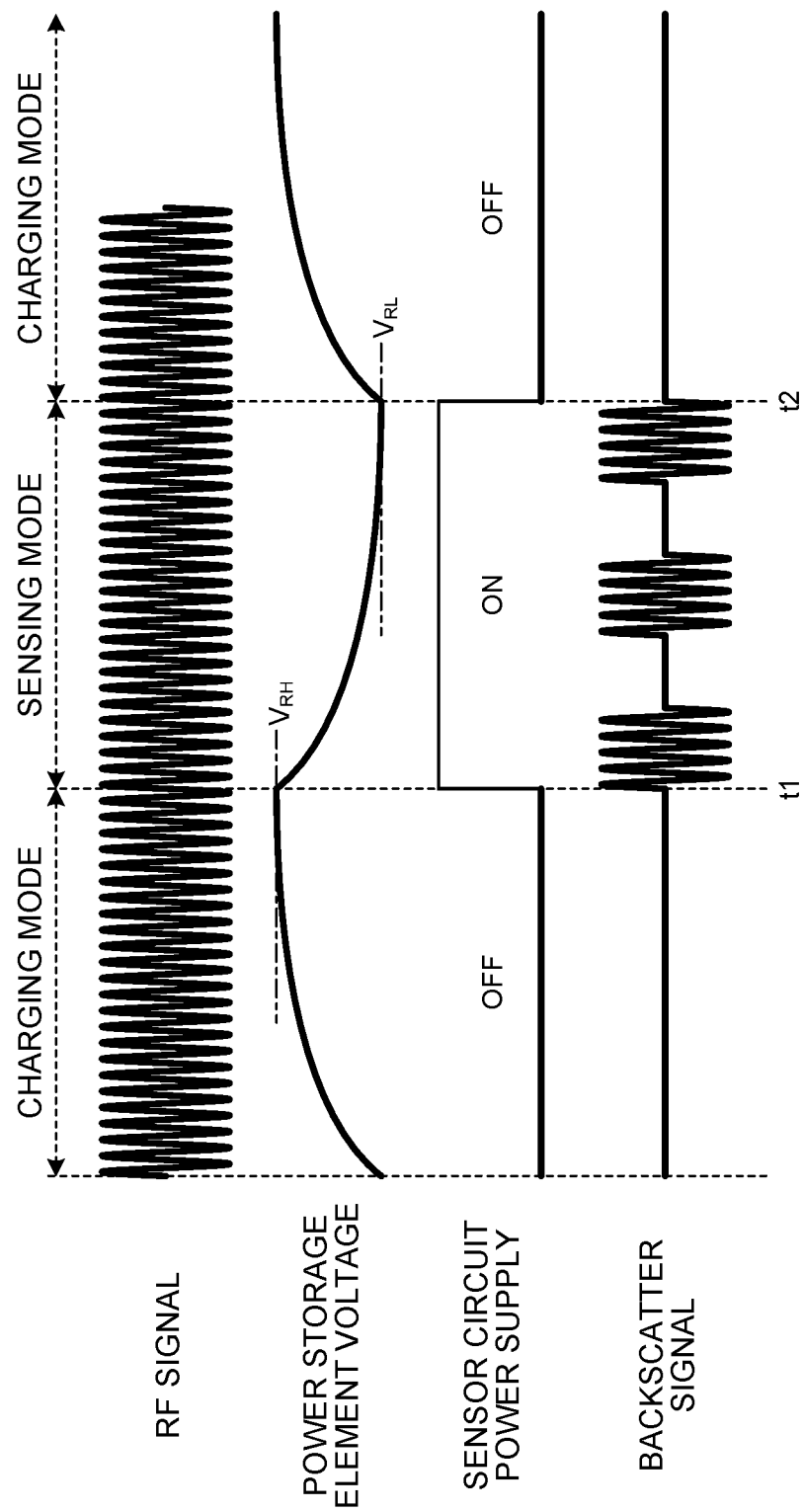
FIG. 10 is a timing chart illustrating an operation of the sensor module including the sensor interface circuit according to the second modification of the embodiment.

For example, battery-less operation is performed as illustrated in FIG. 10. FIG. 10 is a timing chart illustrating an operation of the sensor interface circuit 1$j$ according to the second modification of the embodiment.

In the charging mode, the sensor interface circuit 1$j$ interrupts power supply to the variable oscillation circuits 11 and 12, boosts/rectifies the RF signal, and supplies the boosted/rectified RF signal to the power storage element Cc. The electric charge corresponding to the RF signal is stored in the power storage element Cc, and the voltage of the power storage element Cc increases. When the voltage of the power storage element Cc (for example, a capacitive element) exceeds a threshold voltage $V_{RH}$ and energy corresponding to the threshold voltage $V_{RH}$ is stored in the power storage element Cc, discharge from the power storage element Cc is started at a timing t1. That is, power supply from the power storage element Cc to the variable oscillation circuits 11 and 12 via the power supply control circuit 27$j$ is started, and the power of the sensor circuit including the variable oscillation circuits 11 and 12 is turned on. This causes the operation mode of the sensor interface circuit 1$j$ to shift from the charging mode to the sensing mode, and starts backscatter operation. That is, the variable oscillation circuits 11 and 12 generate the oscillation signals according to the detection values of the sensors 2 and 3, the difference circuit 18 generates the control signal corresponding to a difference between the oscillation signals, and the bias circuit 15 controls on/off of the RF switch 16 according to the control signal. As a result, the transmission signal based on the reflection and absorption of the RF signal is transmitted to the information collection terminal 200.

When the voltage of the power storage element Cc falls below the threshold voltage $V_{RL}$ and the energy stored in the power storage element Cc decreases below the energy corresponding to the threshold voltage $V_{RL}$, power supply to the variable oscillation circuits 11 and 12 is interrupted at a timing t2, and the sensor circuit including the variable oscillation circuits 11 and 12 is turned off. This causes the operation mode of the sensor interface circuit 1$j$ to shift from the sensing mode to the charging mode. In the charging mode, the electric charge is stored in the power storage element Cc again, and the voltage of the power storage element Cc increases.

As illustrated in FIG. 10, an intermittent battery-less sensing operation is possible by repeating the charging mode and the sensing mode. The sensor information can be acquired by monitoring a signal in the sensing mode.

As described above, a part of energy of the RF signal can be charged to the sensor interface circuit 1$j$ in the sensor module 100$j$, thus making battery-less operation possible. This eliminates the necessity of battery replacement and related maintenance, thus making maintenance-free operation possible.

Third Modification of Embodiment

Figure 11:
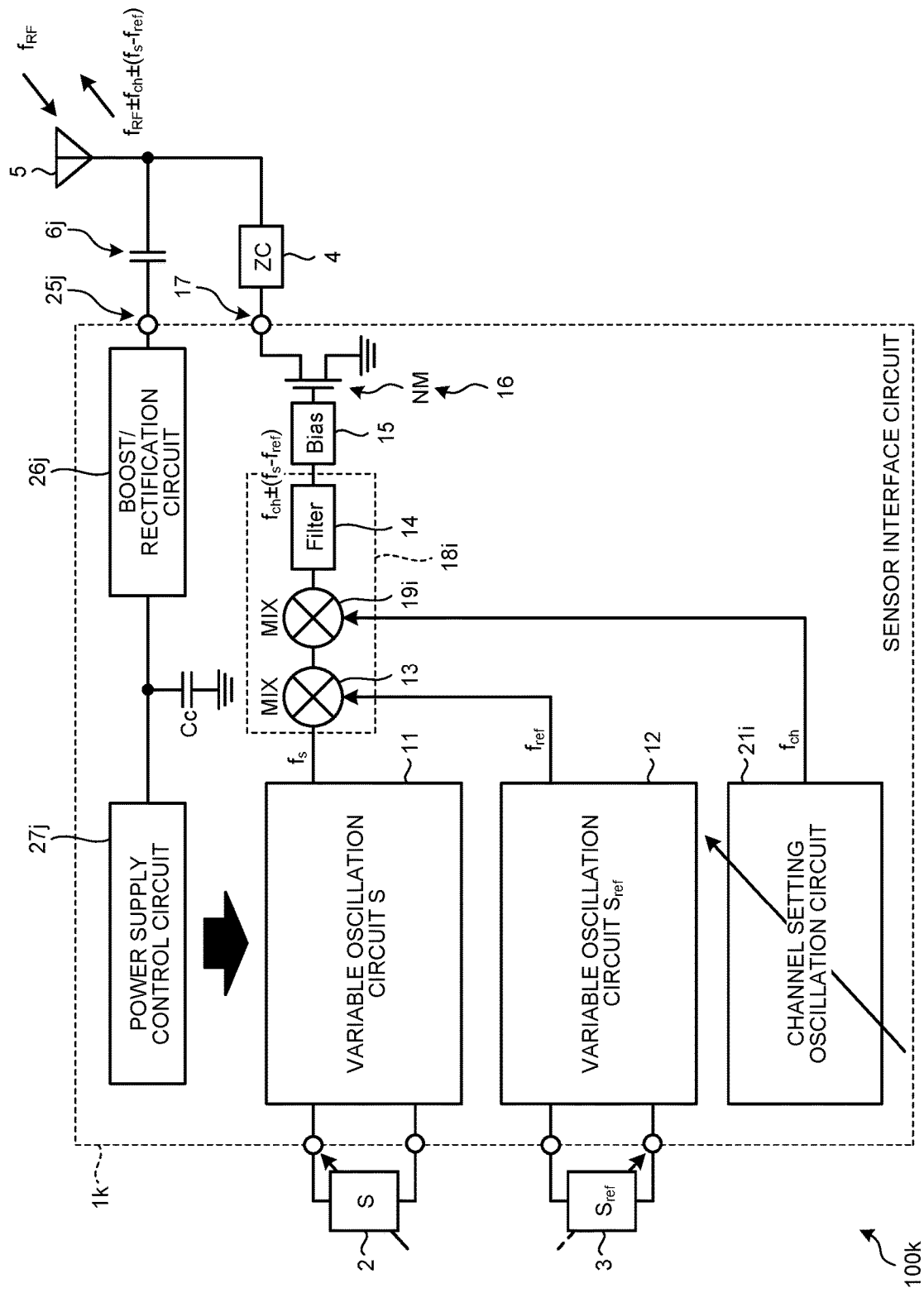
FIG. 11 is a diagram illustrating a configuration of a sensor module including a sensor interface circuit according to a third modification of the embodiment.

Alternatively, as illustrated in FIG. 11, each sensor module 100$k$ may be configured with a combination of the configuration of the first modification of the embodiment and the configuration of the second modification of the embodiment. FIG. 11 is a diagram illustrating a configuration of the sensor module 100$k$ including a sensor interface circuit 1k according to a third modification of the embodiment. That is, in the sensor module 100k, the coupling capacitance 6j is electrically connected between the sensor interface circuit 1k and the antenna 5. The sensor interface circuit 1k includes the difference circuit 18i instead of the difference circuit 18 (see FIG. 2), and further includes the channel setting oscillation circuit 21i, the boost/rectification circuit 26j, and the power supply control circuit 27j. Details of each of the difference circuit 18i and the channel setting oscillation circuit 21i are similar to those of the first modification of the embodiment. Details of each of the coupling capacitance 6j, the boost/rectification circuit 26j, and the power supply control circuit 27j are similar to those of the second modification of the embodiment.

As the channel frequencies fch1 to fchn different from each other are assigned to the plurality of sensor modules 100k-1 to 100k-n in the communication system 300 in this way, it becomes possible to use multichannel. In addition, a part of energy of the RF signal can be charged to the sensor interface circuit 1k in the sensor module 100k, thus making battery-less operation possible. As a result, the collection of the sensor information from the plurality of sensor modules 100k-1 to 100k-n can be performed with battery-less operation.

Fourth Modification of Embodiment

Figure 12:
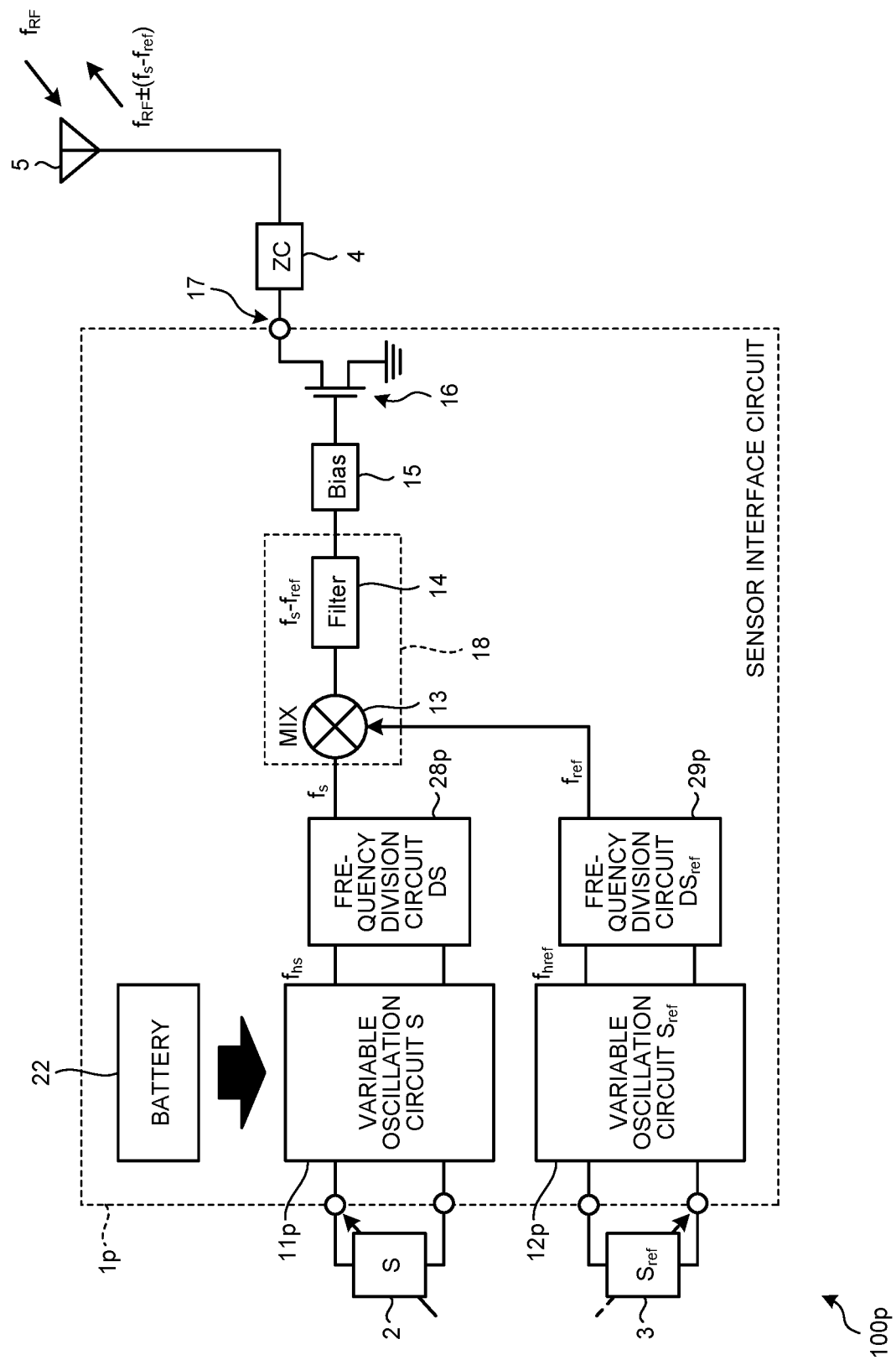
FIG. 12 is a diagram illustrating a configuration of a sensor module including a sensor interface circuit according to a fourth modification of the embodiment.

Alternatively, as illustrated in FIG. 12, each sensor module 100p may be configured so as to be able to acquire the detection values of the sensors 2 and 3 with high resolution. FIG. 12 is a diagram illustrating a configuration of the sensor module 100p including a sensor interface circuit 1p according to a fourth modification of the embodiment.

When a use case in IoT is considered, a signal change of the sensor 2 according to the environment may be weak. Even when the signal change is weak, it is expected that a difference signal at the same level as that of the embodiment can be generated with high accuracy while suppressing the influence of a noise component by improving the resolution in a time direction in signal acquisition and generating a great frequency change corresponding to the signal change at high speed while time-averaging the frequency change.

Based on such an idea, as illustrated in FIG. 12, the sensor interface circuit 1p includes a variable oscillation circuit 11p and a variable oscillation circuit 12p instead of the variable oscillation circuit 11 and the variable oscillation circuit 12 (see FIG. 2), and further includes a frequency division circuit 28p and a frequency division circuit 29p.

The variable oscillation circuit 11p generates an oscillation signal S having a frequency fhs (>fs) higher than that of the variable oscillation circuit 11 of the embodiment in response to the detection value of the sensor 2. The frequency division circuit 28p is electrically connected between the variable oscillation circuit 11p and the difference circuit 18. The frequency division ratio of the frequency division circuit 28p is fhs/(fs). The frequency division circuit 28p divides the frequency of the oscillation signal S of the variable oscillation circuit 11p, generates a frequency division signal DS having the frequency fs, and supplies the frequency division signal DS to the mixer circuit 13 of the difference circuit 18.

The variable oscillation circuit 12p generates an oscillation signal Sref having a frequency fhref (>fref) higher than that of the variable oscillation circuit 12 of the embodiment in response to the detection value of the reference sensor 3. The frequency division circuit 29p is electrically connected between the variable oscillation circuit 12p and the difference circuit 18. The frequency division ratio of the frequency division circuit 29p is fhref/(fref). The frequency division circuit 29p divides the oscillation signal Sref of the variable oscillation circuit 12p, generates a frequency division signal DSref having the frequency fref, and supplies the frequency division signal DSref to the mixer circuit 13 of the difference circuit 18.

Here, the frequency division operation by the frequency division circuits 28p and 29p is an averaging operation (integration operation) on the oscillation signal, thus making high-resolution sensing operation possible. By setting the ratio of the oscillation frequency of the variable oscillation circuits 11p and 12p to the detection values of the sensors 2 and 3 to be high, it is possible to obtain an oscillation signal indicating a great frequency change for a minute change in sensor impedance. By dividing the frequency of the oscillation signal indicating the great frequency change and obtaining a difference signal, it is possible to achieve high-resolution operation with less jitter noise.

As described above, in the sensor module 100p, the variable oscillation circuit 11p and the variable oscillation circuit 12p perform high-resolution oscillation operation, while the frequency division circuits 28p and 29p time-averages the resultant oscillation signals of a high frequency, thus making it possible to generate the difference signal at the same level as that of the embodiment with high accuracy. As a result, it is possible to increase the accuracy and resolution of the sensor module 100p, and to reduce noise during operation of the sensor module 100p.

Fifth Modification of Embodiment

Figure 13:
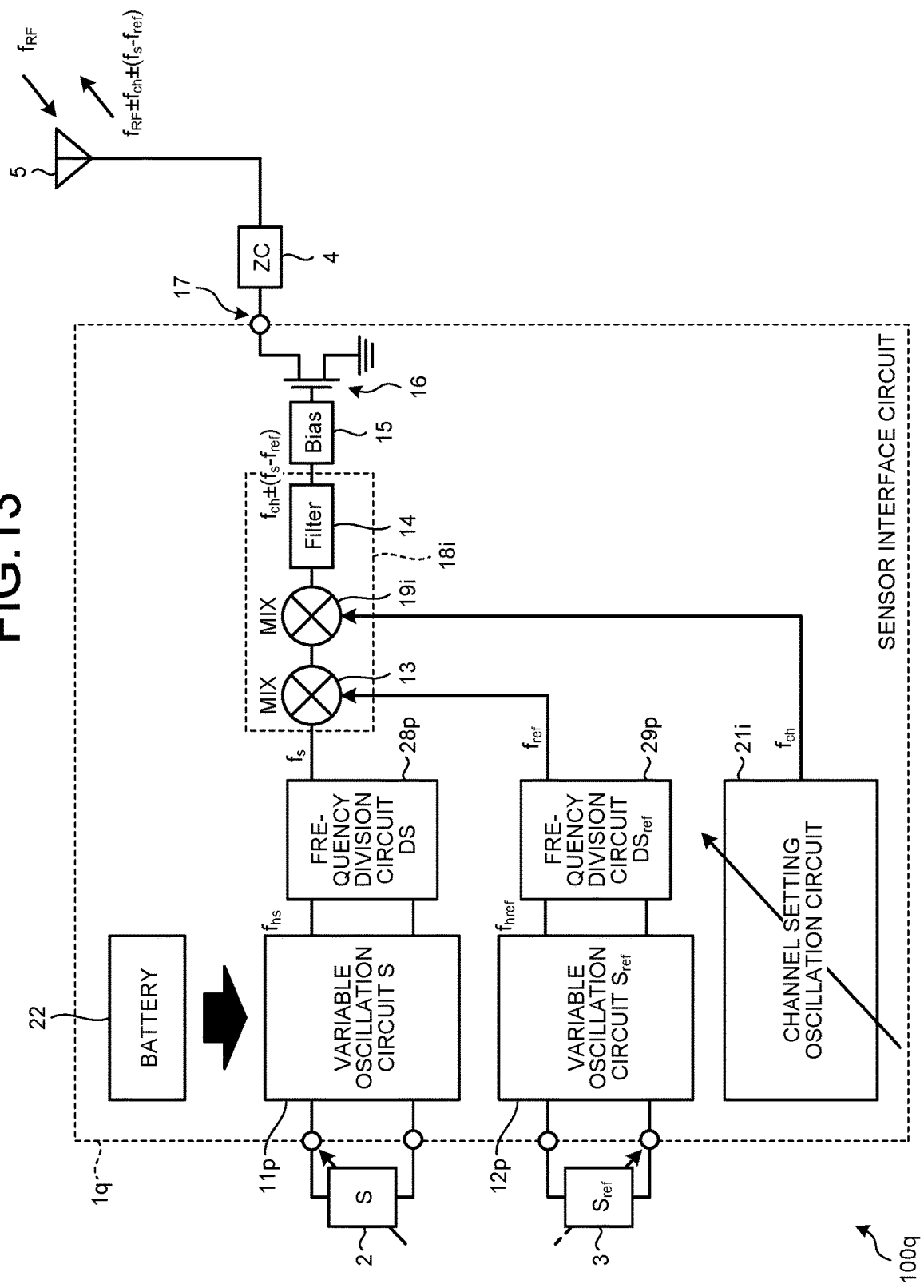
FIG. 13 is a diagram illustrating a configuration of a sensor module including a sensor interface circuit according to a fifth modification of the embodiment.

Alternatively, as illustrated in FIG. 13, each sensor module 100q may be configured with a combination of the configuration of the first modification of the embodiment and the configuration of the fourth modification of the embodiment. FIG. 13 is a diagram illustrating a configuration of the sensor module 100q including a sensor interface circuit 1q according to a fifth modification of the embodiment. That is, the sensor interface circuit 1q includes the difference circuit 18i instead of the difference circuit 18 (see FIG. 12), and further includes the channel setting oscillation circuit 21i. Details of each of the difference circuit 18i and the channel setting oscillation circuit 21i are similar to those of the first modification of the embodiment.

As described above, the channel frequencies fch1 to fchn different from each other are assigned to the plurality of sensor modules 100q-1 to 100q-n in the communication system 300. In addition, in each sensor module 100q, the variable oscillation circuit 11p and the variable oscillation circuit 12p perform high-resolution oscillation operation, while the frequency division circuits 28p and 29p time-averages the resultant oscillation signals of a high frequency, thus making it possible to generate the difference signal at the same level as that of the embodiment with high accuracy. As a result, the distance in the frequency direction from the frequency $f_{RF}$ of the carrier component to the band of each sensor module 100q (see FIG. 8) can be brought close in the frequency spectrum, facilitating the use of multichannel.

Alternatively, although not illustrated, each sensor module may be configured with a combination of the configuration of the third modification of the embodiment and the configuration of the fourth modification of the embodiment.

(Sixth Modification of Embodiment)

Figure 14A:
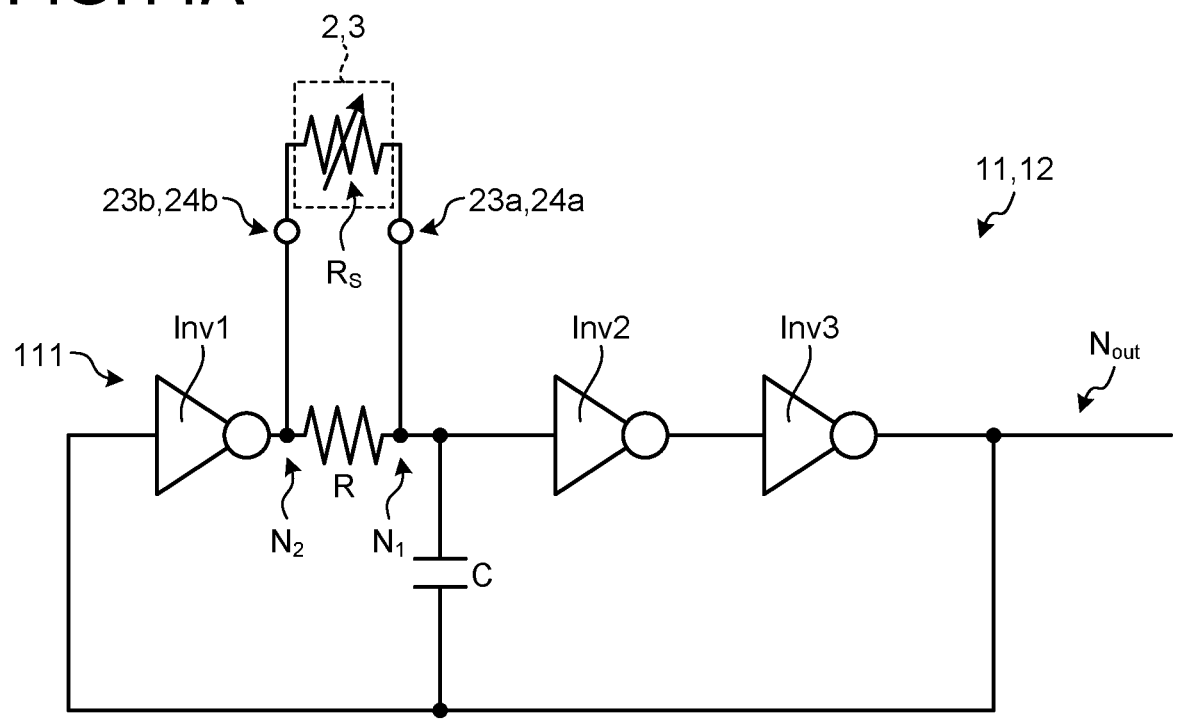
FIGS. 14A and 14B are diagrams illustrating a configuration of a variable oscillation circuit according to a sixth modification of the embodiment.
Figure 14B:
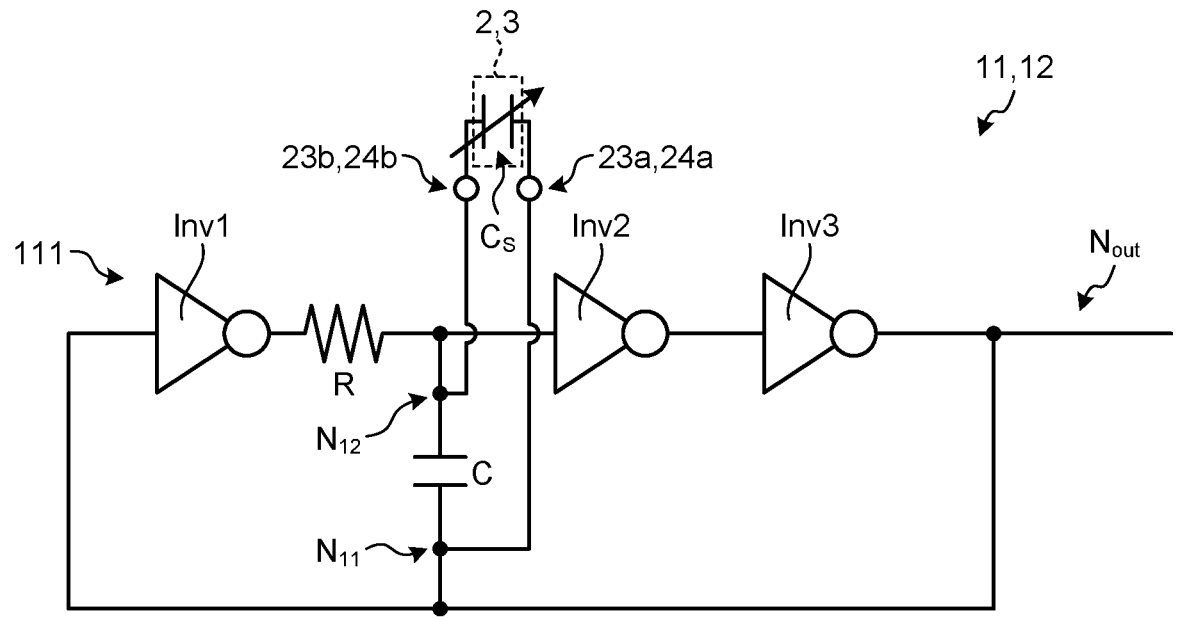

Alternatively, in each sensor interface circuit 1, each of the variable oscillation circuits 11 and 12 may be a relaxation-type oscillation circuit as illustrated in FIGS. 14A and 14B. FIGS. 14A and 14B are diagrams illustrating a configuration of the variable oscillation circuits 11 and 12 according to a sixth modification of the embodiment. FIG. 14A illustrates a case where the sensor 2 and the reference sensor 3 to be connected to the variable oscillation circuits 11 and 12 are resistive sensors, and FIG. 14B illustrates a case where the sensor 2 and the reference sensor 3 to be connected to the variable oscillation circuits 11 and 12 are capacitive sensors.

The variable oscillation circuits 11 and 12 include an inverter chain 111, a resistive element R, and a capacitive element C. The inverter chain 111 includes a plurality of stages of inverters Inv1 to Inv3 connected in a ring shape. The number of stages of the inverters Inv is an odd number, for example, three. The output node of the first-stage inverter Inv1 is electrically connected to the input node of the next-stage inverter Inv2. The output node of the last-stage inverter Inv3 is electrically connected to the output node Nout of the variable oscillation circuits 11 and 12 and the input node of the first-stage inverter Inv1. The resistive element R is electrically connected in series to the plurality of stages of inverters Inv1 to Inv3 in the inverter chain 111. FIGS. 14A and 14B illustrate a configuration in which the resistive element R is electrically connected between the output node of the inverter Inv1 and the input node of the inverter Inv2. The capacitive element C is connected in parallel with the inverter Inv in the inverter chain 111 and the resistive element R. FIGS. 14A and 14B illustrate a configuration in which the capacitive element C is connected in parallel with the first-stage inverter Inv1 and the resistive element R, which are connected in series.

In the case where the sensor 2 and the reference sensor 3 are resistive sensors, the sensors 2 and 3 are electrically connected to both ends of the resistive element R via sensor terminals, as illustrated in FIG. 14A. One ends of the sensor 2 and the reference sensor 3 are electrically connected to the node $N_1$ of the resistive element R on one end side via sensor terminals 23a and 24a, and the other ends of the sensor 2 and the reference sensor 3 are electrically connected to the node $N_2$ of the resistive element R on the other end side via sensor terminals 23b and 24b. The sensors 2 and 3 equivalently function as a variable resistive element Rs whose resistance value varies depending on the detection value. When the resistance value of the variable resistive element Rs changes, a combined resistance value Rall=(R·Rs)/(R+Rs) between the node $N_1$ and the node $N_2$ changes, and a time constant {(R·Rs)/(R+Rs)}×C of the combined resistance value Rall and a capacitance value C of the capacitive element C changes.

In the case where the sensor 2 and the reference sensor 3 are capacitive sensors, the sensor 2 and the reference sensor 3 are electrically connected to both ends of the capacitive element C via sensor terminals, as illustrated in FIG. 14B. One ends of the sensor 2 and the reference sensor 3 are electrically connected to the node $N_{11}$ on one end side of the capacitive element C via sensor terminals 23a and 24a, and the other ends of the sensor 2 and the reference sensor 3 are electrically connected to the node $N_{12}$ of the capacitive element C on the other end side via sensor terminals 23b and 24b. The sensor 2 and the reference sensor 3 equivalently function as a variable capacitive element Cs whose capacitive value varies depending on the detection value. When the capacitance value of the variable capacitance element Cs changes, a combined capacitance value Call=C+Cs between the node $N_{11}$ and the node $N_{12}$ changes, and a time constant R×(C+Cs) of the resistance value of the resistive element R and the combined capacitance value Call changes.

The variable oscillation circuits 11 and 12 illustrated in FIGS. 14A and 14B have a ring configuration with three stages of inverters, and can perform low power consumption operation at a low power supply voltage. The variable oscillation circuits 11 and 12 perform relaxation-type oscillation operation. In the variable oscillation circuits 11 and 12, electric charge is stored in the one end of the capacitive element at a charging speed corresponding to the time constant of the resistive element and the capacitive element. When the voltage of the capacitive element exceeds a threshold of the H level of the inverter Inv2, the output of the inverter Inv2 becomes the L level, the output of the inverter Inv3 becomes the H level, and the output of the inverter Inv1 becomes the L level, and then the electric charge is discharged from the one end of the capacitive element at a discharge speed corresponding to the time constant of the resistive element and the capacitive element. When the voltage of the capacitive element falls below a threshold of the L level of the inverter Inv2, the output of the inverter Inv2 becomes the H level, the output of the inverter Inv3 becomes the L level, and the output of the inverter Inv1 becomes the H level, and then the electric charge is stored in the one end of the capacitive element again. The relaxation-type oscillation operation is achieved by alternately repeating storing and discharging of the electric charge in and from the one end of the capacitive element.

That is, the oscillation frequencies of the variable oscillation circuits 11 and 12 can be determined by the time constant of the resistive element and the capacitive element. The time constant can be expressed by {(R·Rs)/(R+Rs)}×C in the case of FIG. 14A, and can be expressed by R×(C+Cs) in the case of FIG. 14B. The configuration is not a general low-pass filter configuration in which one end of the capacitance terminal is connected to a ground potential, but a configuration in which one end of the capacitance terminal is connected to a feedback loop. With this configuration, a stable operation with low power consumption can be performed. An oscillation signal corresponding to the states of the sensor 2 and the reference sensor 3 can be obtained by connecting the resistive sensor 2 and the reference sensor 3 to both ends of the resistive element R as illustrated in FIG. 14A, or connecting the capacitive sensor 2 and the reference sensor 3 to both ends of the capacitive element C as illustrated in FIG. 14B.

Concerning the configuration illustrated in FIGS. 14A and 14B a first configuration is considered in which the number of stages of the inverters is reduced by one, for example, to two, and the resistive element R and the capacitive element C are interchanged. The first configuration is advantageous for low power consumption operation since the number of stages of the inverters is small, but if the resistance value of the resistive element decreases or the capacitance value of the capacitive element increases, it causes an unstable operation due to the separation of the operation of the two-stage inverters, resulting in a parasitic oscillation being likely to occur. As a result, with the first configuration, the range of the resistance value or the capacitance value of the connectable sensor is limited to prevent the parasitic oscillation, making it difficult to secure a dynamic range of the resistance value or the capacitance value of the applicable sensor.

On the other hand, in the configuration illustrated in FIGS. 14A and 14B, the number of stages of the inverters only needs to be increased by about one, and low power consumption operation can be performed. In addition, the relaxation-type oscillation operation is stably performed by the inverters of odd-numbered stages (for example, three stages) when the resistance value of the resistive element decreases or the capacitance value of the capacitive element increases, and thus a wide range of the resistance value or the capacitance value of the connectable sensor can be secured. Therefore, according to the configurations illustrated in FIGS. 14A and 14B, low power consumption operation can be performed, and a wide dynamic range of the resistance value or the capacitance value of the applicable sensor can be secured.

Seventh Modification of Embodiment

Figure 15:
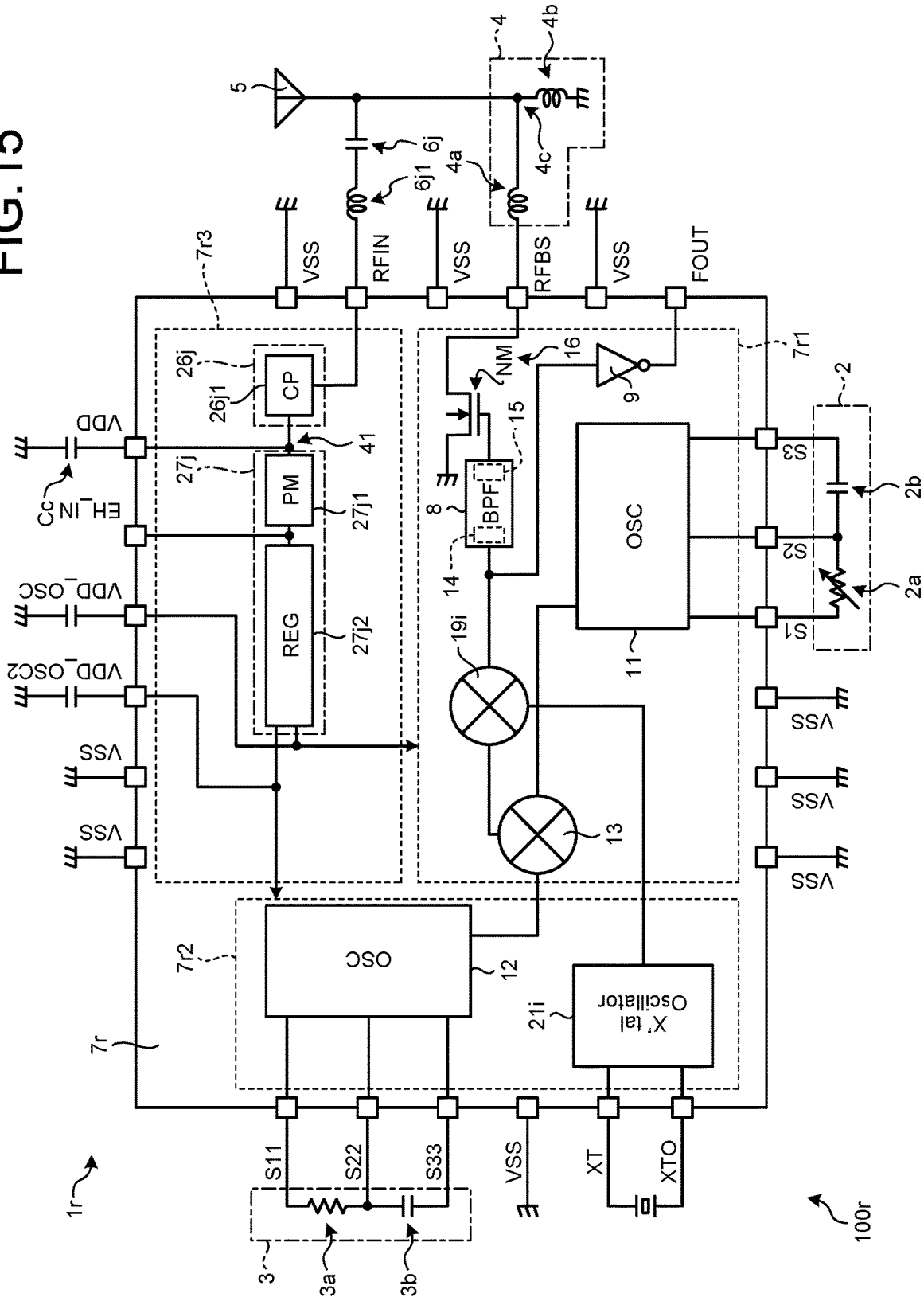
FIG. 15 is a diagram illustrating an implementation configuration of a sensor module including a sensor interface circuit according to a seventh modification of the embodiment.

Alternatively, in each sensor module 100r, a sensor interface circuit 1r may be configured as a semiconductor integrated circuit as illustrated in FIG. 15. FIG. 15 is a diagram illustrating an implementation configuration of the sensor module 100r including the sensor interface circuit 1r according to a seventh modification of the embodiment. The sensor interface circuits according to the embodiment and the first to sixth modifications of the embodiment can be formed as an integrated circuit with a monolithic chip or a plurality of chips. FIG. 15 illustrates an implementation configuration in which the sensor interface circuit 1k according to the third modification of the embodiment is formed as a monolithic integrated circuit. FIG. 15 illustrates a schematic diagram illustrating design results at a transistor level.

The sensor interface circuit 1r illustrated in FIG. 15 is mounted on a semiconductor chip 7r. The semiconductor chip 7r includes a main circuit region 7r1, a sub circuit region 7r2, and a power supply circuit region 7r3.

In the main circuit region 7r1, the RF switch 16, a band pass filter (BPF) circuit 8, an inverter 9, the mixer circuit 13, the mixer circuit 19i, and the variable oscillation circuit 11 are disposed. The BPF circuit 8 includes the filter circuit 14 disposed on the input side and the bias circuit 15 disposed on the output side. The sensor 2 is electrically connected to the variable oscillation circuit 11 via terminals S1, S2, and S3. The sensor 2 includes a resistive element 2a and a capacitive element 2b. When the sensor 2 is a resistive sensor, the resistive element 2a is a variable resistive element.

In the sub circuit region 7r2, the variable oscillation circuit 12 and the channel setting oscillation circuit 21i are disposed. The reference sensor 3 is electrically connected to the variable oscillation circuit 12 via terminals S11, S12, and S13. The reference sensor 3 includes a resistive element 3a and a capacitive element 3b. An original oscillator such as crystal is electrically connected to the channel setting oscillation circuit 21i via terminals XT and XTO.

In the power supply circuit region 7r3, the boost/rectification circuit 26j and the power supply control circuit 27j are disposed. The boost/rectification circuit 26j includes a charge pump (CP) circuit 26j1. The power supply control circuit 27j includes a power management (PM) circuit 27j1 disposed on the input side and a regulator (REG) circuit 27j2 disposed on the output side. The boost/rectification circuit 26j is electrically connected to the antenna 5 via a terminal RFIN, an inductor 6j1, and a capacitor 6j. The power storage element Cc (capacitive element) is electrically externally connected to a node 41 between the boost/rectification circuit 26j and the power supply control circuit 27j via a terminal VDD. The power supply control circuit 27j can supply power to the main circuit region 7r1 via a capacitive element externally connected to a terminal VDD_OSC, and can supply power to the sub circuit region 7r2 via a capacitive element externally connected to a terminal VDD_OSC2.

The RF switch 16 includes, for example, a transistor NM. The transistor NM has a gate electrically connected to the bias circuit 15, a source connected to a ground potential, and a drain electrically connected to the impedance conversion circuit 4 via a terminal RFBS.

The impedance conversion circuit 4 includes inductors 4a and 4b. The inductor 4a has one end electrically connected to the terminal RFBS and the other end electrically connected to a node 4c. The inductor 4b has one end electrically connected to a ground potential and the other end electrically connected to the node 4c. The node 4c is electrically connected to the antenna 5.

As illustrated in FIG. 15, the impedance conversion circuit 4 is electrically externally connected to the transistor NM via the terminal RFBS, thereby making it possible to reduce the size (W×L, W: gate width, L: gate length) of the transistor NM.

Figure 16:
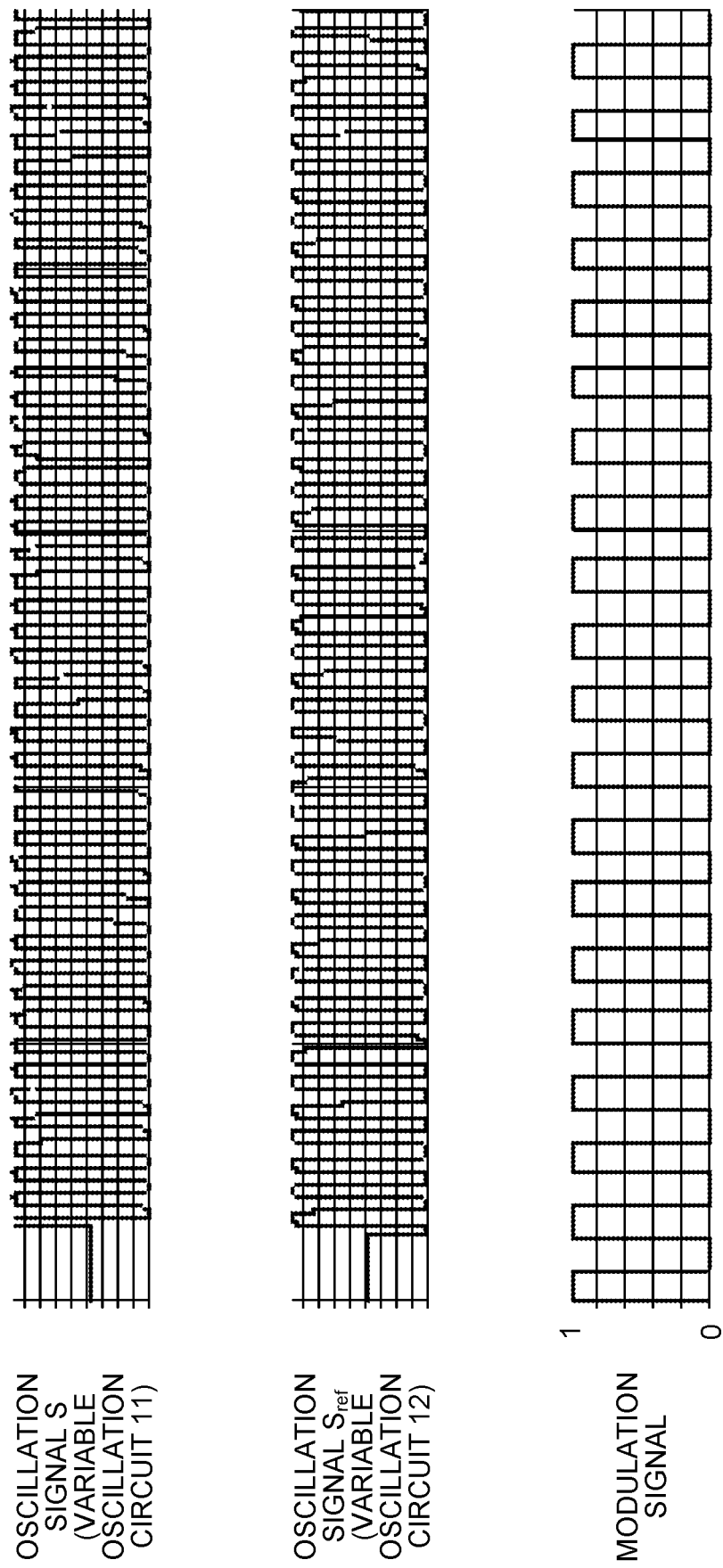
FIG. 16 is a diagram illustrating a simulation result of an operation of the sensor interface circuit according to the seventh modification of the embodiment.
Figure 17:
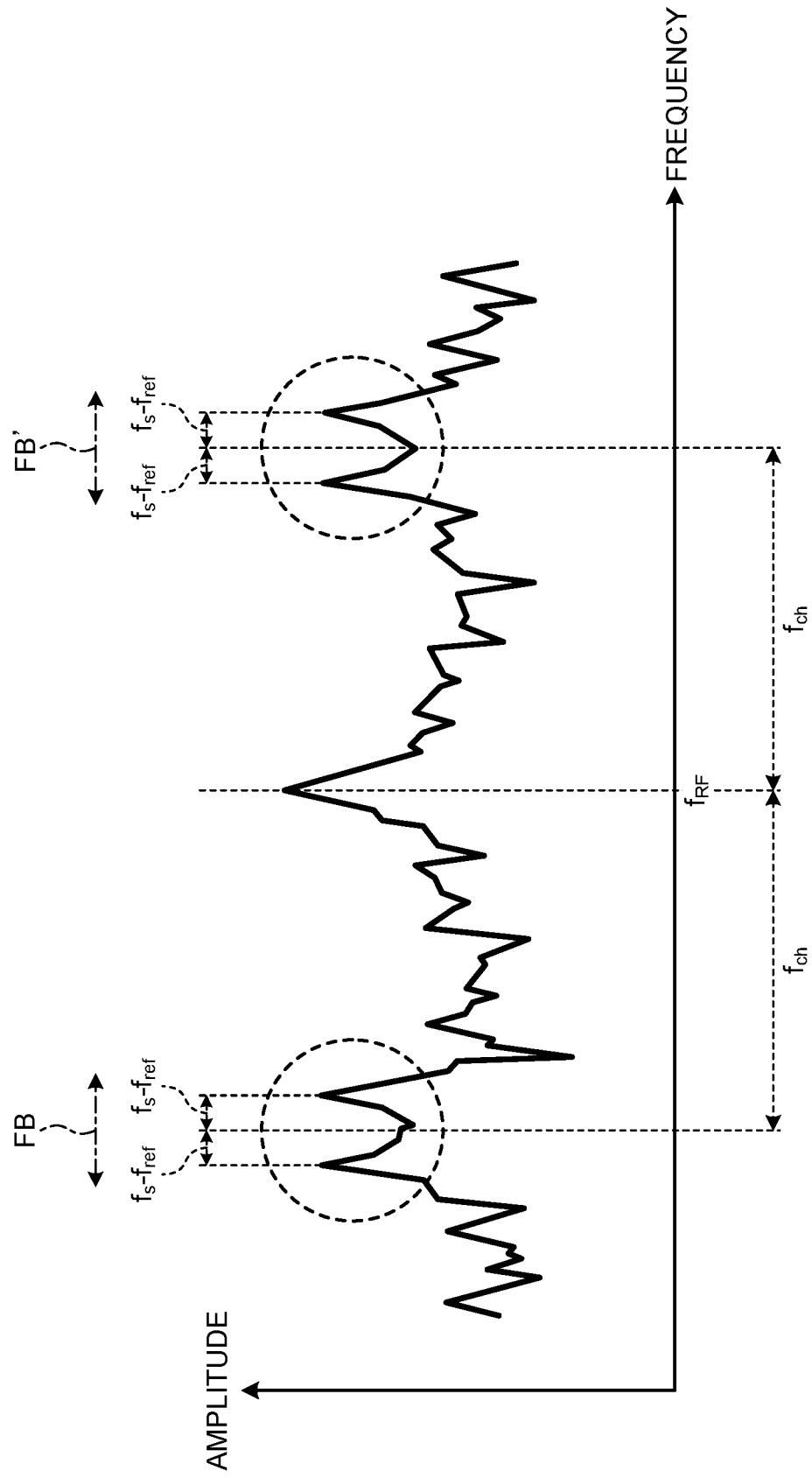
FIG. 17 is a diagram illustrating a simulation result of a frequency spectrum of a transmission signal according to the seventh modification of the embodiment.

Concerning the implementation configuration illustrated in FIG. 15, operation simulation results are illustrated in FIGS. 16 and 17. FIG. 16 is a diagram illustrating a simulation result of an operation of the sensor interface circuit 1r according to the seventh modification of the embodiment. FIG. 17 is a diagram illustrating a simulation result of a frequency spectrum of a transmission signal according to the seventh modification of the embodiment.

As illustrated in FIG. 16, the two variable oscillation circuits 11 and 12 can generate oscillation of about 500 kHz at a power supply voltage of 1 V, and the oscillation signals S and Sref have corresponding relatively low frequencies. The difference circuit 18i (see FIG. 11) including the mixer circuit 13, the mixer circuit 19i, and the filter circuit 14 generates the modulation signal at the relatively low frequency. The bias circuit 15 performs on/off control of the RF switch 16 according to the modulation signal, and the transmission signal based on the reflection and absorption of the RF signal is transmitted to the information collection terminal 200.

FIG. 17 illustrates the simulation result of reflection signal characteristics when the irradiation of the RF signal of 1 GHz is assumed. The antenna condition is assumed to be an ideal state with zero loss. In the frequency spectrum of the transmission signal, a peak of the signal component appears in a portion surrounded by a dotted line in FIG. 17. That is, in the frequency spectrum of the transmission signal, a signal component having a frequency $f_{RF}-fch\pm(fs-fref)$ appears in a band FB, and a signal component having a frequency $f_{RF}+fch\pm(fs-fref)$ appears in a band FB', in addition to the carrier component having the frequency $f_{RF}$. The bands FB and FB' are bands for the sensor module 100r.

In the simulation results illustrated in FIGS. 16 and 17, the power consumption was less than 100 μW, and the battery-less operation as illustrated in FIG. 12 was successfully confirmed by using the irradiation energy of the RF signal of −10 dBm or more.

The power consumption of wireless communication modules such as WiFi, Bluetooth, and ZigBee, which are generally used in the world, has been reduced by applying advanced integrated circuit processes in which the minimum processing dimension is 65 nm or 40 nm or less; nevertheless, battery-less operation is difficult because 1 mW or more power is required.

However, in the seventh modification of the embodiment, low power consumption operation requiring less than 100 μW can be performed using the low-cost integrated circuit technology without using the expensive advanced integrated circuit technology, and thus achieving battery-less operation using wireless signal energy. Furthermore, the sensor terminal can be downsized by forming as an integrated circuit, making it possible to incorporate the sensor terminal into various objects and places (including a human body).

Eighth Modification of Embodiment

Figure 18:
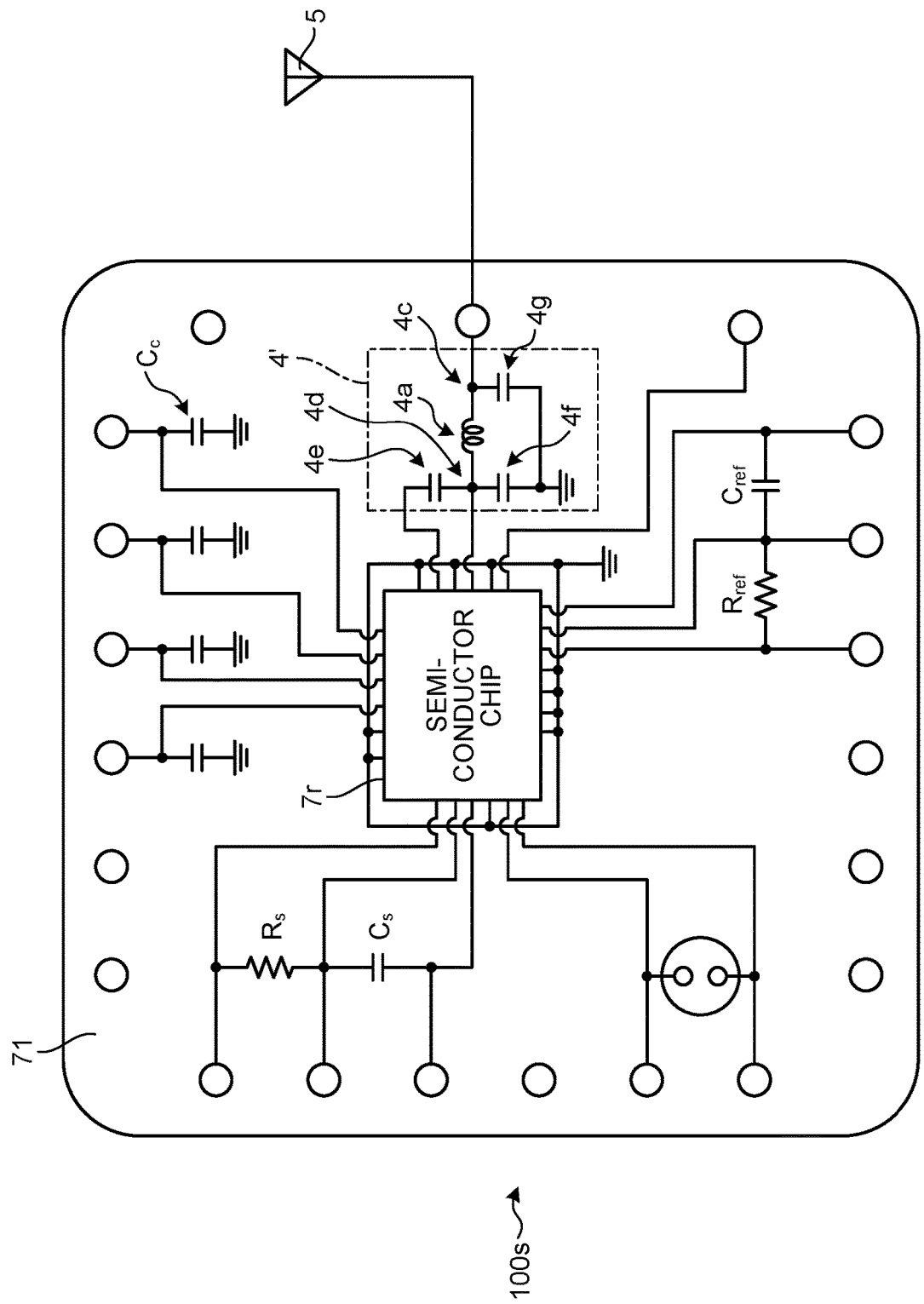
FIG. 18 is a diagram illustrating an implementation configuration of a sensor module including a sensor interface circuit according to an eighth modification of the embodiment.

Alternatively, as illustrated in FIG. 18, each sensor module 100s may be configured such that the semiconductor chip 7r is mounted on a circuit board 71. FIG. 18 is a diagram illustrating an implementation configuration of the sensor module 100s including the sensor interface circuit 1r according to an eighth modification of the embodiment, in which the semiconductor chip 7r is similar to the semiconductor chip 7r illustrated in FIG. 15. FIG. 18 illustrates a circuit configuration of the circuit board 71.

A dielectric substrate can be used as the circuit board 71 illustrated in FIG. 18. An impedance conversion circuit 4' is mounted on the circuit board 71. The impedance conversion circuit 4' includes the inductor 4a and capacitors 4e to 4g. The inductor 4a has one end electrically connected to the terminal RFBS (see FIG. 15) via a node 4d and the other end electrically connected to the node 4c. The capacitors 4e and 4f have one end electrically connected to the terminal RFBS via the node 4c. The capacitor 4g has one end electrically connected to the node 4c and the other end electrically connected to a ground potential. The node 4c is electrically connected to the antenna 5 via a conductor pattern 511.

On the circuit board 71, both ends of the resistive element Rs are electrically connected to the terminals S11 and S22 (see FIG. 15), and both ends of the capacitive element Cs are electrically connected to the terminals S22 and S33. Both ends of a resistive element Rref are electrically connected to the terminals S1 and S2, and both ends of a capacitive element Cref are electrically connected to the terminals S2 and S3. The sensor module 100s operates by adding the sensor 2 to both ends of the resistive element Rs or both ends of the capacitive element Cs, and adding the reference sensor 3 to both ends of the resistive element Rref or both ends of the capacitive element Cref.

Ninth Modification of Embodiment

Figure 19:
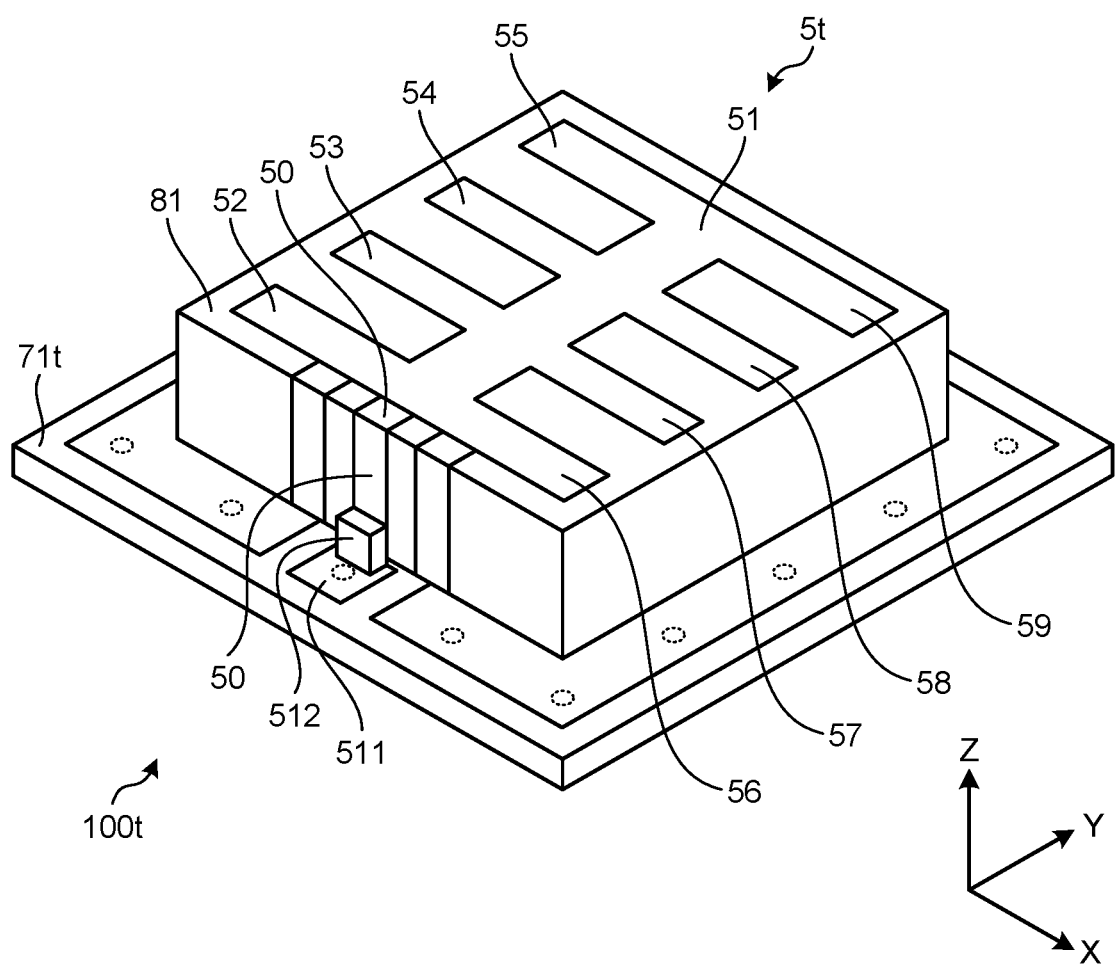
FIG. 19 is a diagram illustrating an implementation configuration of a sensor module including a sensor interface circuit according to a ninth modification of the embodiment.

Alternatively, each sensor module 100t may include a patch antenna used as an antenna 5t, as illustrated in FIG. 19. FIG. 19 is a diagram illustrating an implementation configuration of the sensor module 100t including the sensor interface circuit 1r according to a ninth modification of the embodiment. The antenna 5t is disposed on a cover 81 mounted on a circuit board 71t. Although not illustrated, the semiconductor chip 7r is mounted on the circuit board 71t inside the cover 81. In FIG. 19, a direction perpendicular to the main surface of the circuit board 71t is defined as a Z direction, and two directions orthogonal to each other in a plane perpendicular to the Z direction are defined as an X direction and a Y direction.

The antenna 5t includes a plurality of conductor lines 50 to 59. The conductor line 50 has one end electrically connected to the conductor pattern 511 via a connection member 512. The conductor line 50 extends in the +Z direction from the connection member 512 on the side surface on the -Y side of the cover 81, extends in the +Y direction on the main surface on the +Z side, and is electrically connected to the conductor line 51. The conductor line 51 extends from the vicinity of the end on the -Y side to the vicinity of the end on the +Y side in the +Y direction on the +Z-side main surface of the cover 81. The conductor lines 52 to 55 extend in the -X direction from the conductor line 51 while being away from each other in the Y direction. The conductor lines 56 to 59 extend in the +X direction from the conductor line 51 while being away from each other in the Y direction.

Downsizing the antenna 5t is effective for the downsizing of the sensor module 100t. The antenna used in RFID tags has a large size of 10 cm or more in 920 bands.

On the other hand, the antenna 5t of the ninth modification of the embodiment uses a small patch antenna, and the downsizing is possible due to the configuration of a specific pattern as illustrated in FIG. 19. The size of the antenna 5t is, for example, 10 mm×10 mm.

Although the embodiments of the present invention have been described above, the above embodiments have been presented as examples, and are not intended to limit the scope of the invention. The above-described novel embodiments can be implemented in various other forms, and various omissions, substitutions, and changes can be made without departing from the gist of the invention. These embodiments are included in the scope and gist of the invention, and are included in the invention described in the claims and the equivalent scope thereof.

EXPLANATIONS OF LETTERS OR NUMERALS 1, 1i, 1j, 1k, 1p, 1q, 1r SENSOR INTERFACE CIRCUIT
2 SENSOR
3 REFERENCE SENSOR
4 IMPEDANCE CONVERSION CIRCUIT
5, 5t ANTENNA
6j COUPLING CAPACITANCE
11, 11p, 12, 12p VARIABLE OSCILLATION CIRCUIT
13, 19i MIXER CIRCUIT
14 FILTER CIRCUIT
15 BIAS CIRCUIT
16 RF SWITCH
17, 25j ANTENNA TERMINAL
18, 18i DIFFERENCE CIRCUIT
21i CHANNEL SETTING OSCILLATION CIRCUIT
22 BATTERY
23a, 23b, 24a, 24b SENSOR TERMINAL
26j BOOST/RECTIFICATION CIRCUIT
27j POWER SUPPLY CONTROL CIRCUIT
28p, 29p FREQUENCY DIVISION CIRCUIT
100, 100-1 to 100-n, 100i, 100i-1 to 100i-n, 100j, 100k, 100k-1 to 100k-n, 100p, 100q, 100q-1 to 100q-n, 100r, 100s, 100t SENSOR MODULE
111 INVERTER CHAIN
200 INFORMATION COLLECTION TERMINAL
300 COMMUNICATION SYSTEM

The invention claimed is:

1. A sensor interface circuit comprising:
   an RF switch having a control node;
   a bias circuit electrically connected to the control node and applying, to the control node, a voltage at a first level or a second level corresponding to a linear region of a reflection characteristic within which the RF switch operates;
   a first variable oscillation circuit electrically connectable to a first sensor;
   a second variable oscillation circuit electrically connectable to a second sensor; and
   a difference circuit electrically connected between the first variable oscillation circuit and the second variable oscillation circuit, and the bias circuit.

2. The sensor interface circuit according to claim 1, wherein the first variable oscillation circuit performs oscillation operation according to a detection value of the first sensor and generates a first signal, the second variable oscillation circuit performs oscillation operation according to a detection value of the second sensor and generates a second signal, the difference circuit generates a control signal according to a difference signal between the first signal and the second signal, and the bias circuit applies the voltage to the control node while switching between the first level and the second level according to the control signal.

3. The sensor interface circuit according to claim 1, further comprising:
a third variable oscillation circuit electrically connected to the difference circuit in parallel with the first variable oscillation circuit and the second variable oscillation circuit.

4. The sensor interface circuit according to claim 2, further comprising:
a third variable oscillation circuit electrically connected to the difference circuit in parallel with the first variable oscillation circuit and the second variable oscillation circuit, wherein
the third variable oscillation circuit performs oscillation operation according to a channel frequency to be set and generates a third signal,
the difference circuit generates a control signal according to a difference between the first signal and the second signal, and the third signal, and
the bias circuit applies the voltage to the control node while switching between the first level and the second level according to the control signal.

5. The sensor interface circuit according to claim 1, further comprising:
a rectification circuit electrically connected between an antenna terminal and a power storage element; and
a power supply control circuit electrically connected to the power storage element.

6. The sensor interface circuit according to claim 5, wherein
the power supply control circuit interrupts power supply to the first variable oscillation circuit and the second variable oscillation circuit during a first period, to store electric charge in the power storage element, and supplies power to the first variable oscillation circuit and the second variable oscillation circuit using electric charge of the power storage element during a second period.

7. The sensor interface circuit according to claim 1, further comprising:

a first frequency division circuit electrically connected between the first variable oscillation circuit and the difference circuit; and
a second frequency division circuit electrically connected between the second variable oscillation circuit and the difference circuit.

8. The sensor interface circuit according to claim 1, wherein
the sensor interface circuit comprises a semiconductor integrated circuit.

9. The sensor interface circuit according to claim 1, wherein
each of the first variable oscillation circuit and the second variable oscillation circuit includes:
an inverter chain in which a plurality of stages of inverters are connected in a ring shape;
a resistive element connected in series to the plurality of stages of inverters in the inverter chain; and
a capacitive element connected in parallel with an inverter in the inverter chain and the resistive element, and
a pair of sensor terminals are electrically connected to both ends of the resistive element or both ends of the capacitive element.

10. A sensor module comprising:
an antenna;
a first sensor;
a second sensor; and
a sensor interface circuit comprising:
an RF switch having a control node;
a bias circuit electrically connected to the control node and applying, to the control node, a voltage at a first level or a second level corresponding to a linear region of a reflection characteristic within which the RF switch operates;
a first variable oscillation circuit electrically connectable to the first sensor;
a second variable oscillation circuit electrically connectable to the second sensor; and
a difference circuit electrically connected between the first variable oscillation circuit and the second variable oscillation circuit, and the bias circuit,
wherein the sensor interface circuit is electrically connected between the first sensor and the second sensor, and the antenna.

11. The sensor module according to claim 10, further comprising:
an impedance conversion circuit electrically connected between the antenna and the sensor interface circuit.

* * * * *